(12) United States Patent
Komatsu et al.

(10) Patent No.: US 6,405,610 B1
(45) Date of Patent: Jun. 18, 2002

(54) WAFER INSPECTION APPARATUS

(75) Inventors: Manabu Komatsu, Kawasaki; Kurata Honma, Narita; Akitoshi Kawai, Yokohama; Hisashi Tazawa, Kawasaki; Tsuneo Hasegawa, Toda, all of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/323,113

(22) Filed: Jun. 1, 1999

Related U.S. Application Data

(63) Continuation of application No. 08/739,679, filed on Oct. 29, 1996, now abandoned.

(30) Foreign Application Priority Data

| Nov. 14, 1995 | (JP) | ............................................. | 7-295075 |
| Nov. 21, 1995 | (JP) | ............................................. | 7-302407 |
| Nov. 21, 1995 | (JP) | ............................................. | 7-302408 |
| Nov. 21, 1995 | (JP) | ............................................. | 7-302409 |

(51) Int. Cl.$^7$ ............................................. G01N 19/08
(52) U.S. Cl. ................ 73/865.9; 414/222.01; 414/222.02; 414/222.07
(58) Field of Search ......................... 324/758; 73/865.9, 73/865.8; 414/222, 225, 226, 222.01, 222.02, 222.07

(56) References Cited

U.S. PATENT DOCUMENTS

| 4,582,191 A | | 4/1986 | Weigand | ..................... 414/225 |
| 4,716,299 A | * | 12/1987 | Tanaka et al. | ............... 250/571 |
| 4,746,256 A | | 5/1988 | Boyle et al. | ................. 414/225 |
| 4,789,294 A | | 12/1988 | Sato et al. | .................... 414/222 |
| 4,936,329 A | | 6/1990 | Michael et al. | ............. 414/225 |
| 4,938,654 A | | 7/1990 | Schram | ...................... 414/225 |
| 5,382,806 A | | 1/1995 | Bacchi et al. | ............... 414/223 |
| 5,399,983 A | * | 3/1995 | Nagasawa | .................... 324/758 |
| 5,584,647 A | | 12/1996 | Uehara et al. | .............. 414/222 |
| 5,610,683 A | * | 3/1997 | Takahashi | ..................... 355/53 |

FOREIGN PATENT DOCUMENTS

| JP | 8203981 | * | 3/1997 |
| JP | 09086655 | * | 3/1997 |

* cited by examiner

Primary Examiner—Hezron Williams
Assistant Examiner—Nashmiya Fayyaz
(74) Attorney, Agent, or Firm—Foley & Lardner

(57) ABSTRACT

This invention relates to a wafer inspection apparatus having various types of structures for realizing a reduction in convey time of a selected wafer as an inspection target, an improvement in operability, or the like. In particular, this wafer inspection apparatus has a first convey system and a second convey system. The first convey system is movable in a direction perpendicular to a wafer convey reference surface and has a plurality of arm portions operable independently of each other. The second convey system has a plurality of rotary arm portions that are movable in the direction perpendicular to the wafer convey reference surface. Thus, a structure in which the wafer convey time is shorter than in a conventional wafer inspection apparatus is realized. This wafer inspection apparatus also has a lifting unit with a specific structure, thus realizing an improvement in operability of the apparatus or the like.

6 Claims, 31 Drawing Sheets

Fig.27C
Fig.27D
Fig.27E
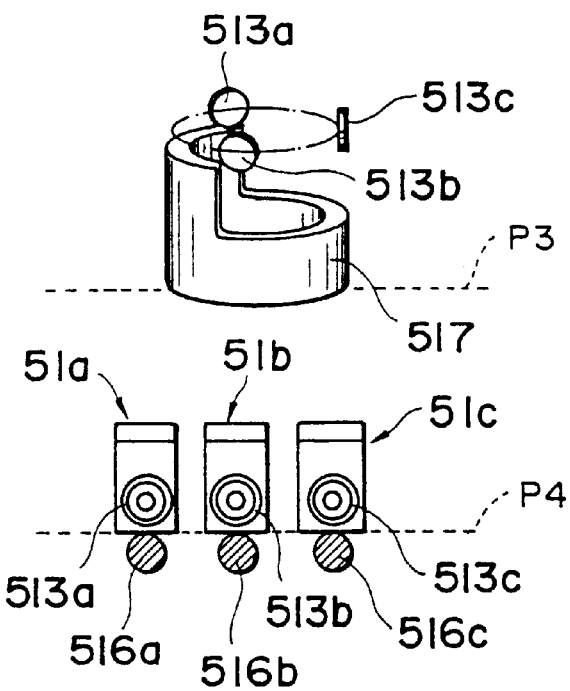
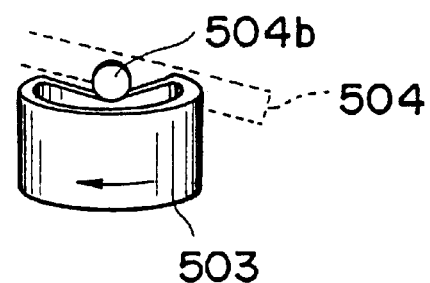

Fig.31A
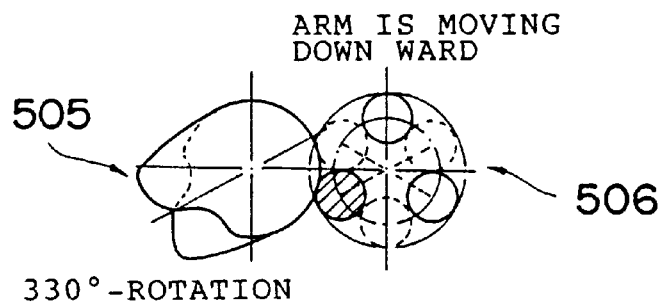
Fig.31B
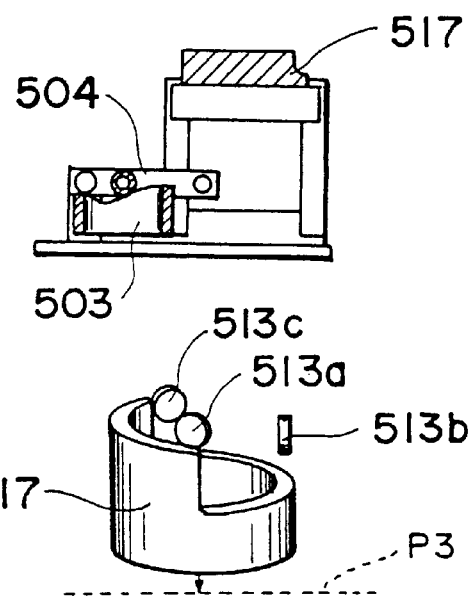
Fig.31C
Fig.31D
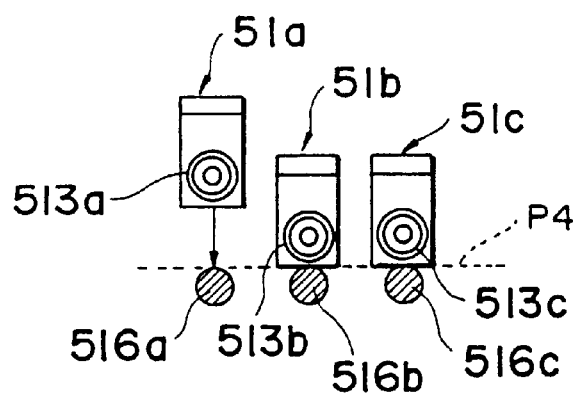
Fig.31E
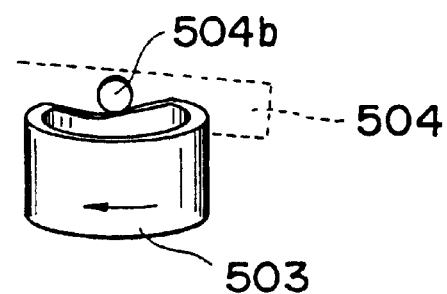

WAFER INSPECTION APPARATUS

This application is a continuation of application Ser. No. 08/739,679, filed Oct. 29, 1996 now abandoned.

BACKGROUND OF THE INVENTION

1. Field of the Invention

The present invention relates to a wafer inspection apparatus and, more particularly, to various types of structures for realizing a reduction in convey time of a wafer as an inspection target, an improvement in operability, or the like.

2. Related Background Art

A conventional wafer inspection apparatus has at least a microscopic observation system in order to observe a wafer serving as an inspection target by using a microscope. In order to realize automatic microscopic observation of the wafer, the conventional wafer inspection apparatus generally has a function of temporarily storing the wafer and a structure for conveying the wafer to a desired position to microscopically observe it.

SUMMARY OF THE INVENTION

An object of the present invention is to provide a wafer inspection apparatus having various types of structures for realizing a reduction in convey time of a wafer as an inspection target, an improvement in operability, or the like. A wafer inspection apparatus according to the present invention has at least a wafer convey system and a microscopic observation system to realize efficient wafer observation.

More specifically, in the wafer inspection apparatus according to the present invention, as shown in FIGS. 1 to 3, at least a first convey system 4 and a second convey system 5 prepared as the wafer convey system, and a macro observation system 6 and a microscopic observation system 7 prepared as the observation system are mounted on a main flat surface 1a of an operation board 1 on which an input unit 100, e.g., a pointing device, is provided. This wafer inspection apparatus is also provided with a monitor 8 for displaying a desired image, e.g., control information, character information, or the like, regarding operation for wafer inspection.

Most of these systems mounted on the operation board 1 are covered with a cover 9 except at least the observation systems 6 and 7, to ensure the safety of the person, the operator, or the like who is in charge of wafer inspection. The portions that handle the wafer are exposed from a major surface 90 of the cover 9 through a plurality of openings 92 and 94 (see FIG. 2). Accordingly, the wafer serving as the inspection target is conveyed through the space above the main surface 1a of the operation board 1. Thus, in this specification, the main surface 1a of the operation board 1 corresponds to a wafer convey reference surface of the wafer inspection apparatus according to the present invention. Each lifting unit 2 has a driving system for moving its setting surface 2a in a direction perpendicular to the main surface 1a as the wafer convey reference surface.

The wafer inspection apparatus according to the present invention has the lifting units 2 on a power supply unit 11. Each lifting unit 2 has the setting surface 2a on which a cassette member 3 for storing wafers can be set, and positions the cassette member 3 at a predetermined position while holding it.

In particular, when the cassette member 3 is set a on the setting surface 2a of the lifting unit 2, the setting surface 2a is positioned, with reference to the main surface 1a of the operation board 1 of the wafer inspection apparatus, at a position lower than the observation reference surface on which the conveyed wafer is set. In this manner, since the cassette member 3 storing the wafers can be set on the lifting unit 2 easily, a physical burden to the operator or the like who handles the cassette member 3 can be reduced, thereby improving the operability of the wafer inspection apparatus. In other words, as shown in FIG. 1, the position Q2 corresponding to a mount surface of the operation board 1 on which the cassette member 3 is set is lower than the position Q1 corresponding to the main surface 1a of the operation board 1. Therefore, the mount surface (position Q2) on which the lifting unit 2 is set is positioned at a lower position than the main surface 1a (position Q1) in the direction perpendicular to the main surface 1a. The lifting unit 2 can position the setting surface 2a at a lower position than the main surface 1a of the operation board 1. In this specification, the observation reference surface means a plane including a main surface 60a (see FIG. 17) of a wafer stage 60, that holds the wafer, of the macro observation system 6 for allowing visual inspection by the observer, or a main surface 741 (see FIG. 18) of a holder 740, that holds the wafer, and in parallel with respect to the main surface 1a of the operation board 1.

A plurality of types of cassette members 3 having different sizes (e.g., a 4-inch wafer cassette member and a 8-inch wafer cassette member) can be set on the setting surface 2a of the lifting unit 2, respectively. The lifting unit 2 has a first detector 20a and a second detector 20b. The first detector 20a is provided in an area of the setting surface 2a where a first area AR1 which is in contact with a small cassette member and a second area AR2 which is in contact with a large cassette member overlap. The second detector 20b is provided in a portion of the second area AR2 which does not overlap the first area AR1. The first detector 20a outputs a first detection signal when a cassette member of any size is set on the setting surface 2a of the lifting unit 2. The second detector 20b outputs a second detection signal when a large cassette member is set on the setting surface 2a of the lifting unit 2.

With this arrangement, a main controller 10 can determine that a small cassette member is set on the lifting unit 2 when it receives the first detection signal from the first detector 20a and does not receive the second detection signal from the second detector 20b, and can determine that a large cassette member is set on the lifting unit 2 when it receives the first and second detection signals from both of the first and second detectors 20a and 20b. The main controller 10 controls the input unit 100, e.g., a pointing device 1b or a keyboard 1c, the lifting unit 2 including the first and second detectors 20a and 20b and the driving system for moving the setting surface 2a, the microscopic observation system 7 including the X–Y stage 71 (see FIG. 18), the macro observation system 6 including a driving system (see FIG. 17), the first convey system 4 including a driving system (see FIGS., 10, 15 and 16), the second convey system 5 including the driving system (see FIG. 22), and the monitor 8 in a centralized manner, as shown in, e.g., FIG. 3.

As described above, this wafer convey system includes the cassette member 3 set on the lifting unit 2, the first convey system 4 for conveying wafers between the cassette member 3 and a predetermined area located between the cassette member 3 and the observation system, and the second convey system 5 for conveying wafers between the predetermined area and the observation system. Further, the first convey system 4 extracts and stores the wafers from and in the cassette member 3. In particular, each of the convey systems 4 and 5 has a mechanism for conveying the wafers while correcting a difference between the setting surface 2a and the observation reference surface 741 (or 60a) in a direction perpendicular (in the direction of height) to the main surface 1a (the wafer convey reference surface) of the operation board 1.

The first convey system 4 has, as shown in FIG. 10, a first arm portion 48, a second arm portion 49, and a support portion 41. The first arm portion 48 extracts a wafer as an inspection target from the cassette member 3 set on the lifting unit 2 and holds the extracted wafer. The second arm portion 49 holds the wafer inspected by the observation system 6 and 7, and stores the inspected wafer in the cassette member 3. The support portion 41 holds the first and second arm portions 48 and 49 to be spaced apart from each other by a predetermined distance in a direction perpendicular to the wafer convey reference surface. In particular, the support portion 41 includes a height correction mechanism for moving the first and second arm portions 48 and 49 independently of each other in the direction perpendicular to the wafer convey reference surface while it holds them. In this manner, in the wafer inspection apparatus according to the present invention; since the first convey system 4 has the first and second arm portions 48 and 49 operable independently of each other, efficient wafer conveyance is realized.

This height correction mechanism includes a driving source 42 and a cam mechanism 410, as shown in, e.g., FIGS. 11 to 13. The driving source 42 drives the cam mechanism 410 in order to supply a driving force in the direction perpendicular to the wafer convey reference surface to the first and second arm portions 48 and 49. The cam mechanism 410 moves the first and second arm portions 48 and 49 independently of each other in the direction perpendicular to the wafer convey reference surface. Furthermore, the cam mechanism 410 is provided with a first cam groove 410a and a second cam groove 410b (see FIG. 14). The first cam groove 410a serves to move the first arm portion 48 in one direction perpendicular to the wafer convey reference surface. The second cam groove 410b can move the second arm portion 49 in a direction perpendicular to the wafer convey reference surface and opposite to the moving direction of the first arm portion 48. Movement control of each of the first and second arm portions 48 and 49 in the direction perpendicular to the wafer convey reference surface is performed by the main controller 10 in accordance with the size of the wafer as the inspection target.

More specifically, the first arm portion 48 has a first arm head 48a for holding the wafer, a first support arm 43 which is supported by the support portion 41 and supports the first arm head 48a, and a driving mechanism provided in the first support arm 43. The driving mechanism in the first support arm 43 moves the first arm head 48a in parallel with respect to the wafer convey reference surface and the first support arm 43 relative to the support portion 41 and in parallel with respect to the wafer convey reference surface. Similarly, the second arm portion 49 has a second arm head 49a, a second support arm 44, and a driving mechanism for moving the second arm head 49a.

Furthermore, as shown in, e.g., FIGS. 22 to 26, the second convey system 5 has a plurality of rotary arm portions 51a to 51c, a support shaft 50, and a driving mechanism. The plurality of rotary arm portions 51a to 51c can hold the wafer. The support shaft 50 supports the plurality of rotary arm portions 51a to 51c at its distal end portion and extends in the direction perpendicular to the wafer convey reference surface. The driving mechanism integrally rotates the plurality of rotary arm portions 51a to 51c by rotating the support shaft 50.

More specifically, the driving system of the second convey system 5 has first and second cam mechanisms. The first cam mechanism rotates the support shaft 50 at a predetermined timing (see FIG. 24). As shown in FIG. 26, the second cam mechanism pushes up at least a selected one of the plurality of rotary arm portions 51a to 51c in the direction perpendicular to the wafer convey reference surface (corresponding to the main surface 1a of the operation board 1). The rotary arm portion 51a has a rotary arm head 510a capable of holding the wafer, and an engaging member (including at least a support member 511a and a guide receptacle 512a) for supporting the rotary arm head 510a. This engaging member is slidably attached to a linear guide 50b provided on the side surface of the support shaft 50 in the direction perpendicular to the wafer convey reference surface. Other rotary arm portions 51b and 51c have the same structure.

Since the first and second convey systems 4 and 5 have the above arrangement, the first position where the wafer is transferred from the first convey system 4 to the second convey system 5 and the second position where the wafer is transferred from the second convey system 5 to the first convey system 4 are shifted from each other in the direction perpendicular to the wafer convey reference surface (FIGS. 33 and 34).

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIGS. 4 to 6 show the entire structure of a cassette member, in which FIG. 4 is a perspective view of the cassette member, FIG. 5 is a plan view of the cassette member of FIG. 4 seen from a direction of an arrow A, and FIG. 6 is a plan view showing the bottom surface of the cassette member of FIG. 4 seen from a direction of an arrow B;

FIGS. 11 to 13 are views for explaining the structure and operation of the height correction mechanism of the first convey system, in which FIG. 11 is a perspective view showing a cylindrical cam provided in the height correction mechanism, FIG. 12 is a perspective view showing the support structure of the first and second arm portions of the height correcting mechanism, and FIG. 13 is a plan view showing the upper portion of the support structure of the first and second arm portions of the height correction mechanism;

FIGS. 27A to 32E are views for sequentially explaining the wafer convey operation (the vertical motion and rotary motion) of the second convey system starting from the initial state, in which FIGS. 27A, 28A, 29A, 30A, 31A, and 32A show the state of the cam mechanism shown in FIG. 23, FIGS. 27B, 28B, 29B, 30B, 31B, and 32B show the vertical motion of a stepped cam, FIGS. 27C, 28C, 29C, 30C, 31C, and 32C show the spatial positional relationship between the stepped cam and the respective rotary arm portions, FIGS. 27D, 28D, 29D, 30D, 31D, and 32D show the spatial positional relationship between the respective rotary arm portions and stoppers (that regulate the initial positions of the corresponding rotary arm portions), and FIGS. 27E, 28E, 29E, 30E, 31E, and 32E show the state of an annular cam for controlling the vertical motion of the stepped cam;

FIGS. 33 and 34 are schematic views (perspective views) for explaining the wafer convey operation between the first and second convey systems, in which FIG. 33 is a view for explaining a wafer convey operation from the first convey system to the second convey system, and FIG. 34 is a view for explaining a wafer convey operation from the second convey system to the first convey system;

FIGS. 35 and 36 are schematic views (sectional views taken along the line XXXV—XXXV of FIG. 33) for explaining the wafer convey operation from the first convey system to the second convey system, in which FIG. 35 shows the rotary arm portion before movement, and FIG. 36 shows the rotary arm portion after movement; and FIGS. 37 and 38 are schematic views (sectional views taken along the line XXXVII—XXXVII of FIG. 34) for explaining the wafer convey operation from the first convey system to the second convey system, in which FIG. 37 shows the rotary arm portion before movement, and FIG. 38 shows the rotary arm portion after movement.

DESCRIPTION OF THE PREFERRED EMBODIMENT

A wafer inspection apparatus according to a preferred embodiment of the present invention will be described with reference to FIGS. 1 to 38.

Figure 1:
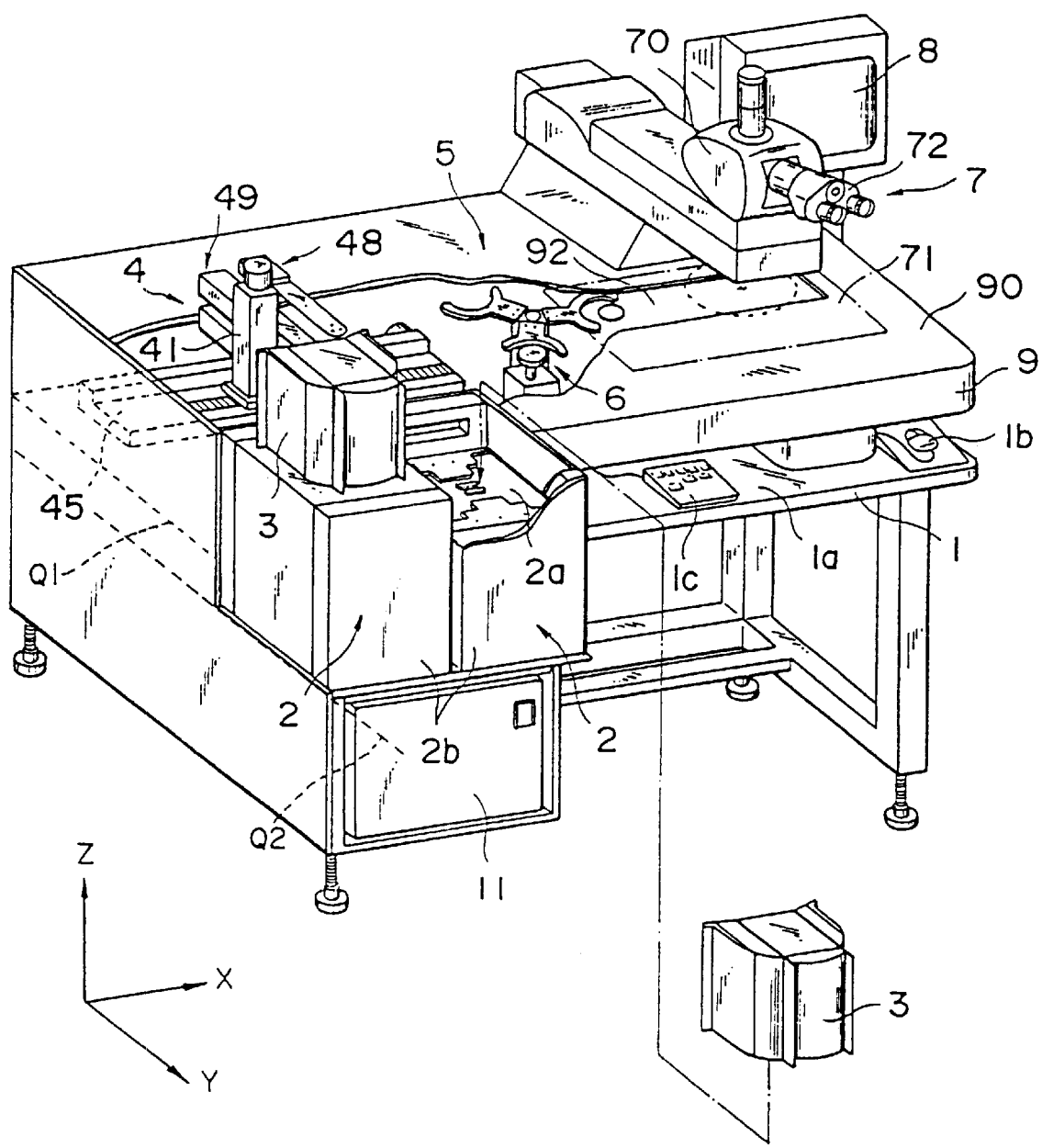
FIG. 1 is a perspective view showing the entire structure of a wafer inspection apparatus according to the present invention.
Figure 2:
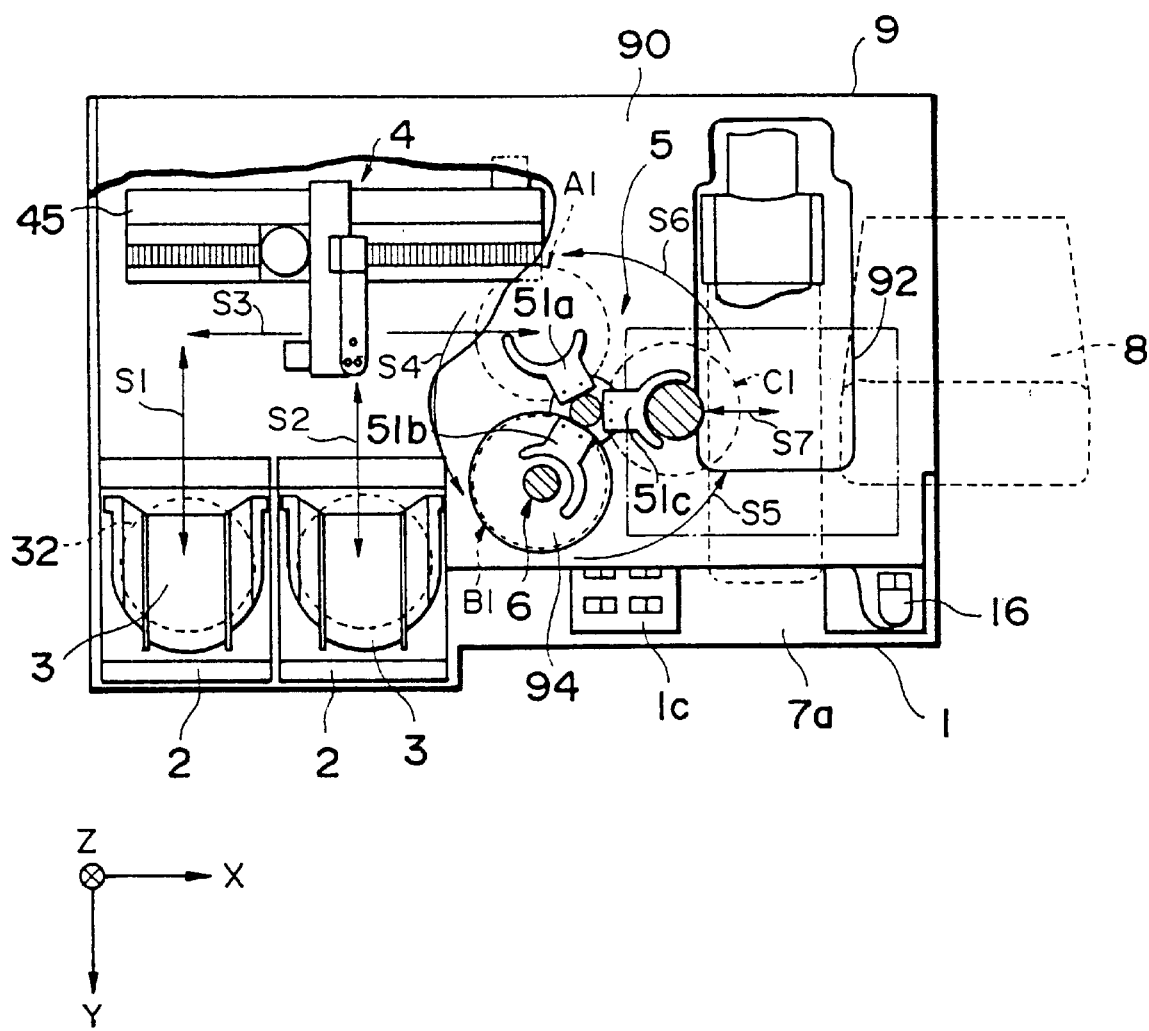
FIG. 2 is a plan view of the wafer inspection apparatus shown in FIG. 1.

FIG. 1 is a perspective view showing the entire structure of the wafer inspection apparatus according to the present invention, and FIG. 2 is a plan view of the wafer inspection apparatus shown in FIG. 1.

The wafer inspection apparatus shown in FIGS. 1 and 2 has an operation board 1 on which an input unit 100 (see FIG. 3), e.g., a pointing device 1b and a keyboard 1c, is mounted. At least a first convey system 4 (including a driving system of FIGS. 15 and 16), a second convey system 5 (including a driving system of FIG. 22), a macro observation system 6 (including a driving system of FIG. 17), and a microscopic observation system 7 (including an X–Y stage 71 of FIG. 18) are mounted on a main surface 1a of the operation board 1. The first convey system 4 extracts and stores a wafer 32 from and into a cassette member 3 storing wafers 32 as the inspection targets. The second convey system 5 can transfer and receive the wafer 32 to and from the first convey system 4 and conveys and recovers the wafer 32 to and from various types of observation systems. The macro observation system 6 observes defects, e.g., a scratch, on the wafer surface through visual observation of the operator. Lifting units 2 are loaded on a power supply unit 11. Each lifting unit 2 holds the cassette member 3 storing the wafers 32 at a predetermined position (a predetermined position in a direction perpendicular to a wafer convey reference surface) while the cassette member 3 is set on its setting surface 2a. The cassette member 3 is set on the lifting unit 2 by the operator.

This wafer inspection apparatus has a cover 9 covering most of these systems 4, 5, 6 and 7 by considering safety of the operator. At least openings 92 and 94 are formed in the major surface 90 of the cover 9 to expose parts of the observation systems 6 and 7. Accordingly, since the wafer 32 as the inspection target is conveyed above the main surface 1a of the operation board 1, the main surface 1a of the operation board 1 is defined as the wafer convey reference surface in the specification. This wafer inspection apparatus also has a monitor 8 which displays the inspection result of the wafer 32 and the states of the systems and which is utilized when performing a setting operation of an inspection recipe (input by the operator through the input unit 100) with a main controller 10 to be described later.

The first convey system 4 has a wafer extracting first arm portion 48 (its distal end portion can move in parallel to the wafer convey reference surface 90), a wafer storing second arm portion 49 (its distal end portion can move parallel to the wafer convey reference surface independently of the first arm portion 48), and a support portion 41 for movably supporting these first and second arm portions 48 and 49 in the direction of height. With this arrangement, the respective arm portions 48 and 49 of the first convey system 4 can move in directions indicated by arrows S1 and S2 in FIG. 2.

Also, since the support portion 41 conveys the wafer between the cassette member 3 and the second convey system 5, it moves on the support table 45 in a direction indicated by an arrow S3 in FIG. 2.

The second convey system 5 has a support shaft 50 having a rotary axis extending in the direction perpendicular to the wafer convey reference surface and first to third rotary arm portions 51a to 51c slidably mounted on this distal end portion of the rotary shaft 50. The second convey system 5 sequentially rotates the rotary arm portions 51a to 51c in a direction indicated by arrows S4 to S6 in FIG. 2, thereby conveying the wafer 32 to a desired observation system (including the systems 6 and 7).

Figure 3:
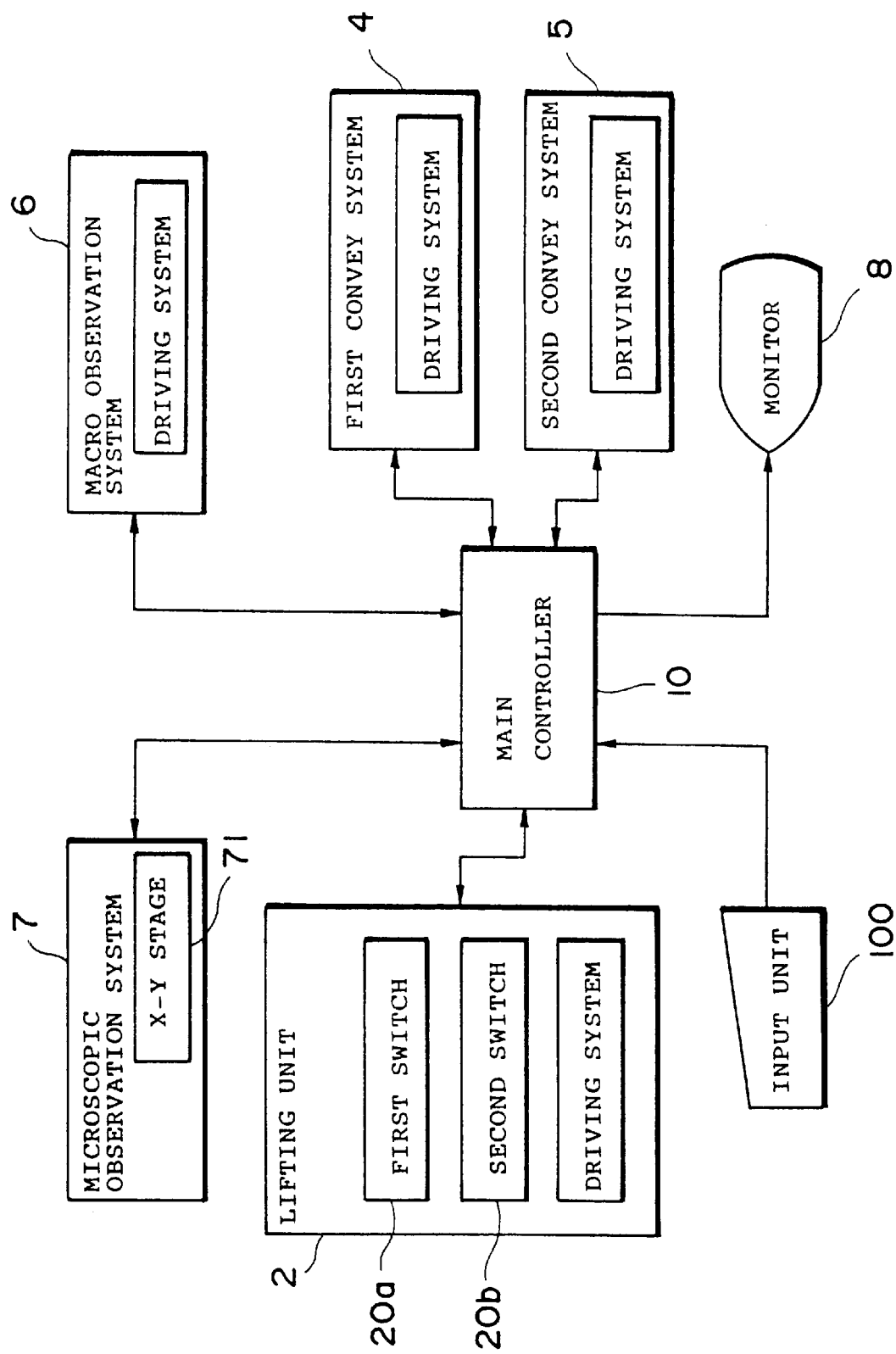
FIG. 3 is a block diagram showing the major structure of the wafer inspection apparatus according to the present invention.

FIG. 3 is a block diagram showing the main structure of the wafer inspection apparatus according to the present invention. As is seen from FIG. 3, the systems 2, 4, 5, 6, 7, 8, and 100 of this wafer inspection apparatus are managed by the main controller 10 in a centralized manner.

The structure of the cassette member 3 will be described with reference to FIGS. 4 to 6.

As described above, the plurality of wafers 32 are stored in the cassette member 3. This cassette member 3 is detachably set on the vertically movable lifting unit 2 (wafer storing unit) so that a desired wafer can be extracted from it. The cassette members 3 can be prepared as a 4-inch wafer cassette member, a 5-inch wafer cassette member, a 6-inch wafer cassette member, and an 8-inch wafer cassette member, and the sizes of these cassette members differ in accordance with the sizes of the wafers 32.

Figure 4:
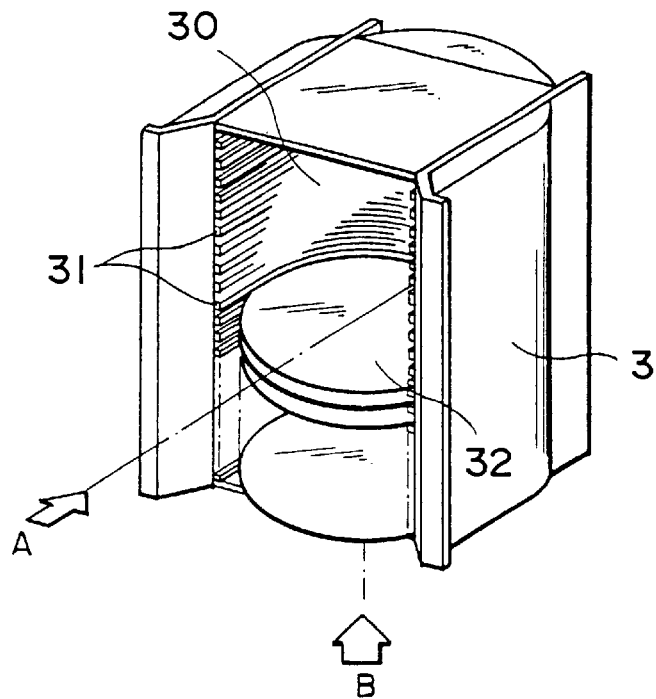

More specifically, as shown in FIG. 4, the cassette member 3 has an opening 30 for allowing extraction or storage of the wafers 32. Spacers 31 are provided in the internal space of the cassette member 3 for storing the plurality of wafers 32 as the inspection targets to be spaced apart from each other by a predetermined distance. The heights of the cassette members 3 for storing the wafers 32 are the same among the 4-inch to 6-inch wafer cassette members.

Figure 5:
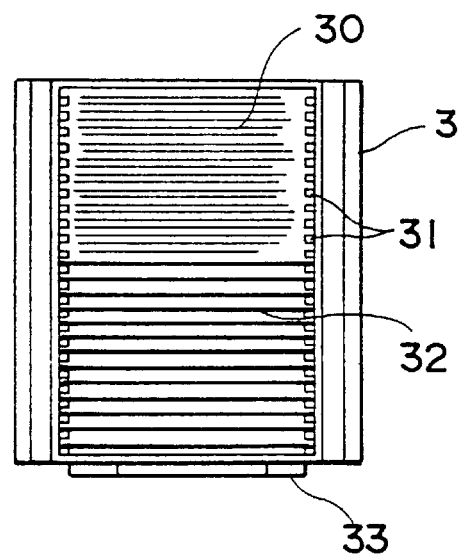
Figure 6:
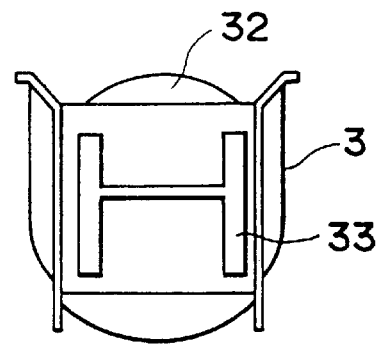

FIG. 5 is a front view showing the structure of the cassette member 3, which is seen from a direction indicated by an arrow A in FIG. 4. FIG. 6 is a view showing the structure of the bottom surface (mounting surface to the lifting unit 2) of the cassette member 3, which is seen from a direction indicated by an arrow B in FIG. 4. As shown in FIGS. 5 and 6, an H-shaped projection 33 is formed on the bottom surface of the cassette member 3. The projection 33 engages with alignment members 21a to 21d formed on the setting surface 2a of the lifting unit 2, so that the cassette member 3 is stably set on the lifting unit 2.

Figure 7:
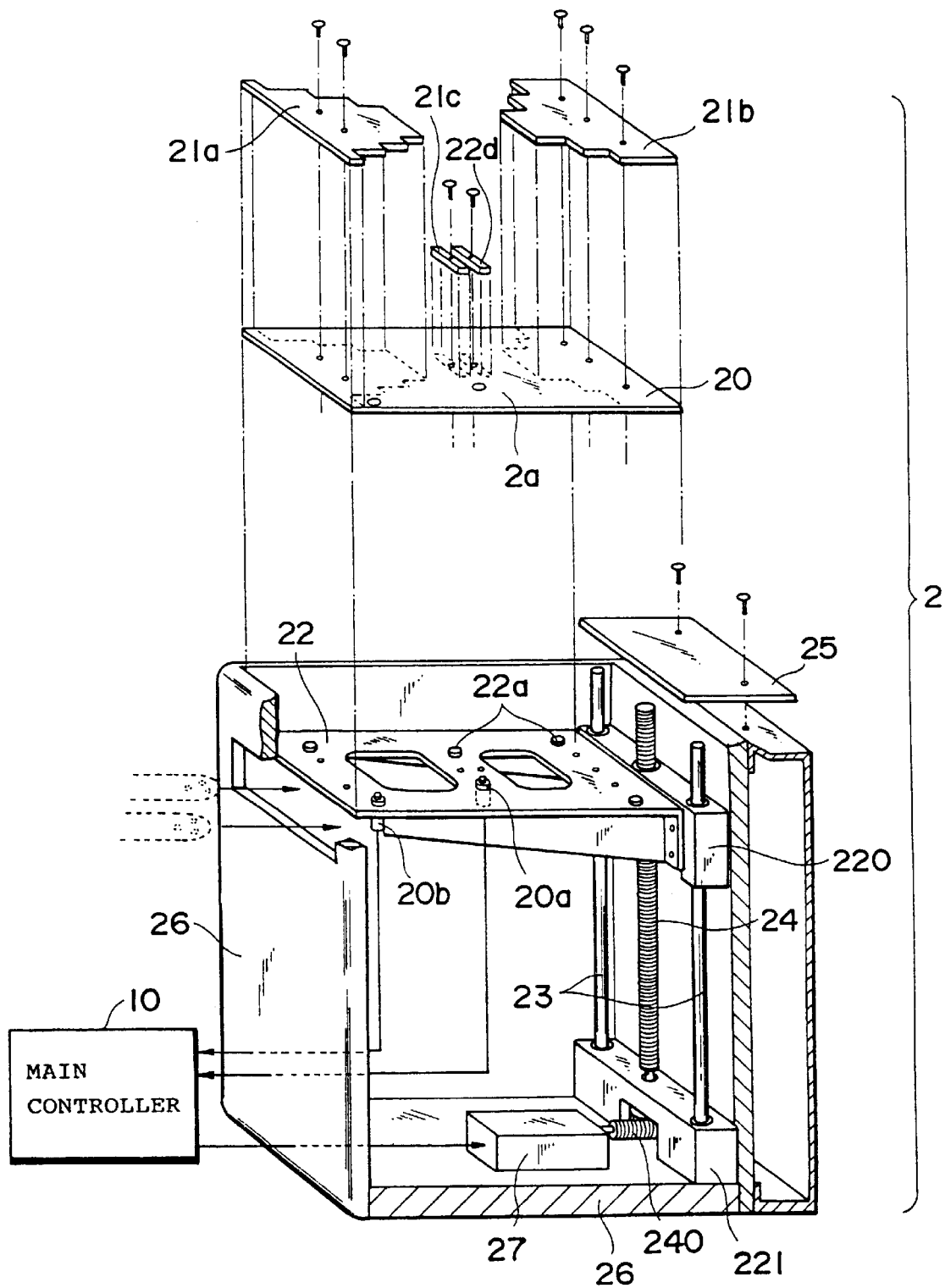
FIG. 7 is an assembly process view showing the internal structure of a lifting unit.

The structure of the lifting unit 2 will be described with reference to FIGS. 7 to 9. FIG. 7 is an assembly process view of the lifting unit 2, and FIGS. 8 and 9 are plan and inner side views, respectively, of the completed lifting unit 2.

The setting surface 2a on which the cassette member 3 is set corresponds to the upper major surface of a setting plate 20. The alignment members 21a to 21d that engage with the projection 33 of the cassette member 3 to position the cassette member 3 are mounted on the setting surface 2a. This setting plate 20 is mounted on a support plate 22 through spacers 22a. First and second switches 20a and 20b (first and second detectors) for confirming the presence of the cassette member 3 are arranged at predetermined positions on the support plate 22. The main controller 10 can confirm the presence of a cassette member 3 of a predetermined size from detection signals from the switches 20a and 20b.

One end of the support plate 22 is fixed to a linear bridge 220 formed with through holes through which guide pins 23 and a first lead screw 24 for moving the setting surface 2a in the vertical direction extend. The guide pins 23 and the first lead screw 24 are fixed on a base 26 as they are clamped by a reinforcing plate 25 and a gear portion 221 which is fixed on the base 26. A motor 27 drives upon reception of an instruction from the main controller 10 and rotates the first lead screw 24 through a second lead screw 240, thereby vertically moving the linear bridge 220 (supporting the setting plate 20). Therefore, the driving system of the lifting unit 2 is constituted by at least the motor 27, the first and second lead screws 24 and 240, the gear portion 221, and the linear bridge 220. A side wall 2b of the lifting unit 2 has a window 200b for passing the first and second arm head 48a and 49a therethrough at the time of extraction or storage of the wafers 32. Therefore, at the time of wafer conveyance, the position of the setting surface 2a on which the cassette member 3 is set is determined with reference to the position of the window.

Figure 8:
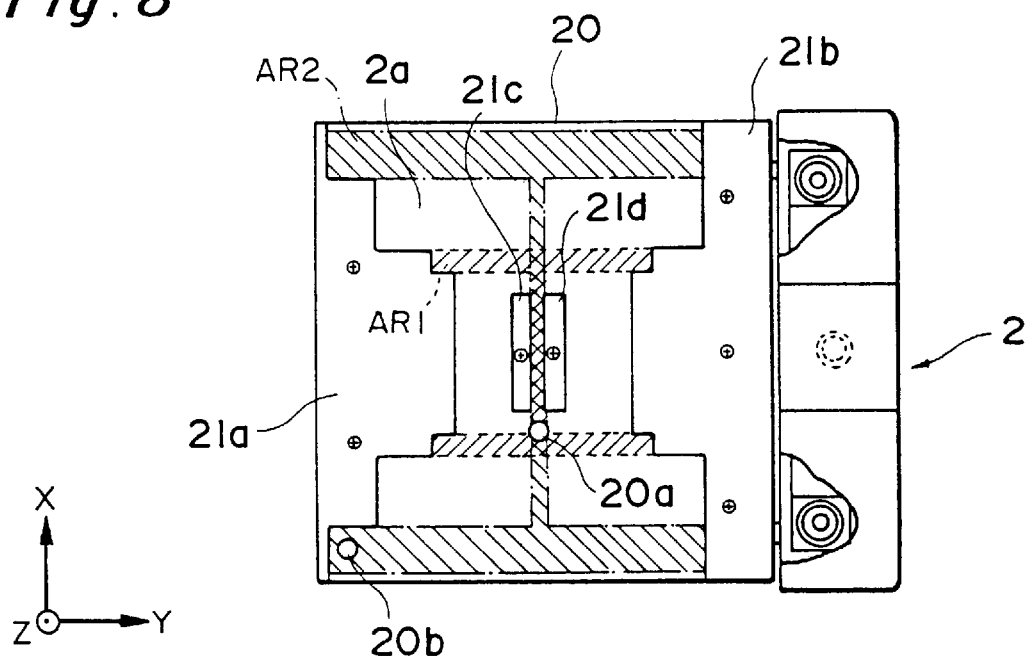
FIG. 8 is a plan view of the upper portion of the lifting unit to show the arrangement of the setting surface of the cassette member.
Figure 9:
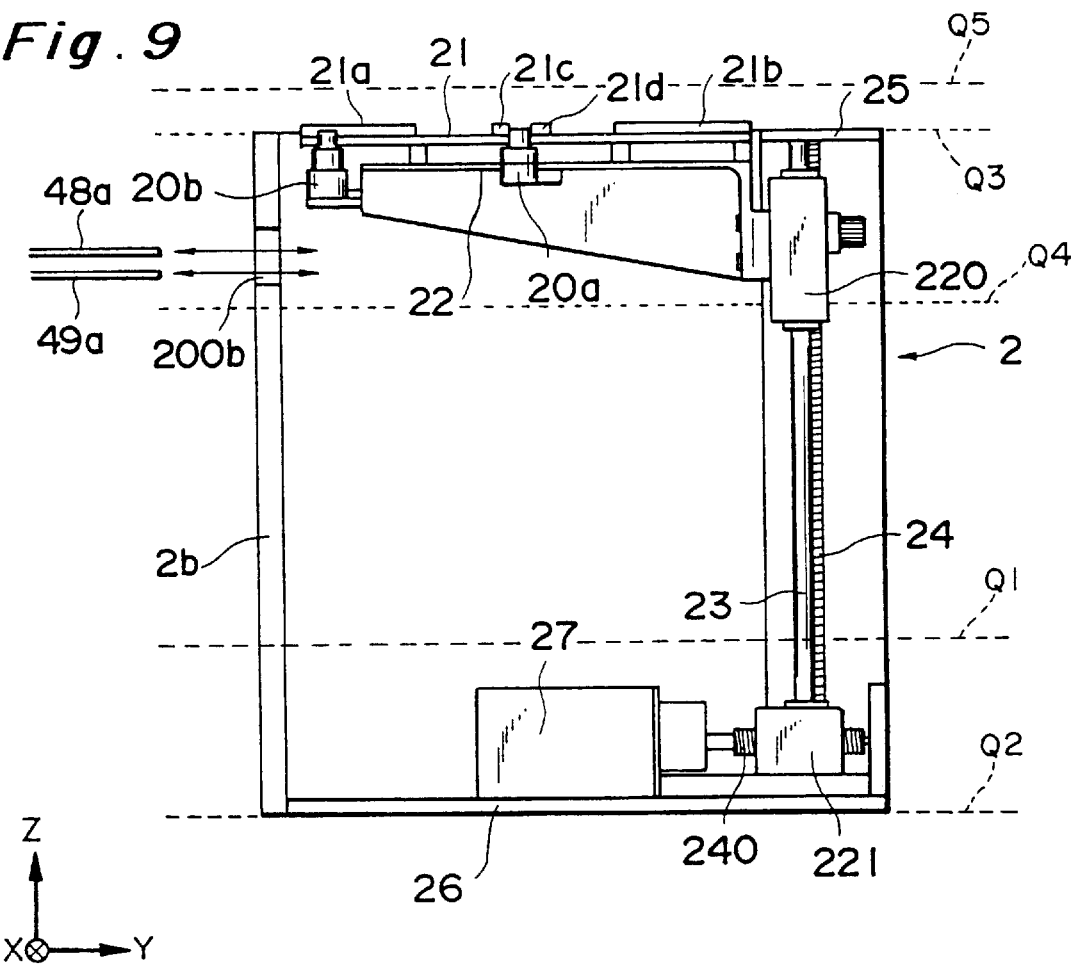
FIG. 9 is a side view showing the internal structure of the lifting unit.

FIGS. 8 and 9 show the lifting unit 2 in a state where the cassette member 3 is removed. An area AR1 in FIG. 8 surrounded by a broken line indicates a position where a 4-inch wafer cassette member is mounted, and an area AR2 in FIG. 8 surrounded by an alternate long and short dash line indicates a position where an 8-inch wafer cassette member is mounted.

The first switch 20a is a depression switch arranged in an overlapping area of the areas AR1 and AR2. The first switch 20a outputs an ON signal (detection signal) to the main controller 10 when a 4-inch wafer cassette member 3 is mounted on the setting surface 2a and outputs an OFF signal (non-detection signal) to the main controller 10 when this cassette member 3 is removed from the setting surface 2a.

More specifically, the first switch 20a outputs an ON signal when any one of cassette members for 4-inch to 8-inch wafers is mounted on the lifting unit 2.

The second switch 20b is a depression switch arranged in an area of the area AR2 not overlapping the area AR1. The second switch 20b is located at a position where it does not contact the projection 33 of any one of cassette members for 4-inch to 6-inch wafers.

More specifically, the second switch 20b outputs an ON signal (detection signal) to the main controller 10 only when the cassette member for 8-inch wafer is mounted, and outputs an OFF signal otherwise.

The lifting unit 2 is driven by the motor 27, and the driving force of the motor 27 is transmitted to the first lead screw 24 through the second lead screw 240 attached to the gear portion 221. The setting plate 20 moves vertically as it is guided by the linear bridge 220 engaging with the lead screw 24.

In particular, the position Q3 in FIG. 9 shows the position of the setting surface 2a to be positioned at the time of setting the cassette member 3 by the operator, and the position Q4 in FIG. 9 shows the initial position of the setting surface 2a to be positioned at the time of wafer conveyance. Further, the position Q1 shows the main surface 1a of the operation board 1, and the position Q2 shows the mount surface of the operation board 1 positioned at a lower position than the main surface 1a. The positions Q3 and Q4 are shifted from each other in a direction perpendicular to the main surface 1a. Still further, the position Q5 shows the position corresponding to the observation reference surface 741 (60a). Therefore, when the cassette member 3 is set on the setting surface 2a of the lifting unit 2, the setting surface 2a is positioned at a lower position than the observation reference surface 741 with reference to the main surface 1a of the operation board 1.

As described above, since the sizes of the cassette members 3 differ in accordance with the types of the wafers 32 to be stored, conventionally, the operator instructs the size of the wafers 32 to the convey unit.

For this reason, when, e.g., an 8-inch wafer is to be extracted from the cassette member 3, if the operator erroneously instructs to convey a 6-inch wafer, the apparatus cannot extract the wafer from the cassette member 3. In a worst case, the wafer can be damaged by the apparatus.

In the apparatus according to the present invention, the first detector 20a is arranged in the first area AR1 and the second detector 20b is arranged outside the first area AR1 and inside the second area AR2. Thus, cassette members having different sizes can be discriminated with a simple arrangement in a small space. Therefore, conveyance of the wafer will not fail or the wafer will not be damaged.

The first detector 20a generates an ON signal (detection signal) when any of the cassette members having different sizes is mounted, and the second detector 20b generates an ON signal (detection signal) only when a cassette member having a larger size is mounted, so that cassette members having different sizes can be discriminated. Therefore, conveyance of the wafer will not fail or the wafer will not be damaged.

Furthermore, the main controller 10 determines that a small cassette member is mounted in the lifting unit 2 upon reception of only an ON signal from the first detector 20a, and determines that a large cassette member is mounted in the lifting unit 2 upon reception of an ON signal from the second detector 20b. Therefore, conveyance of the wafer will not fail or the wafer will not be damaged.

The wafer storage system including at least the lifting unit 2 having such a detection function and the main controller 10 can also be used as the wafer storage unit of other apparatuses, e.g., an exposure apparatus.

Figure 10:
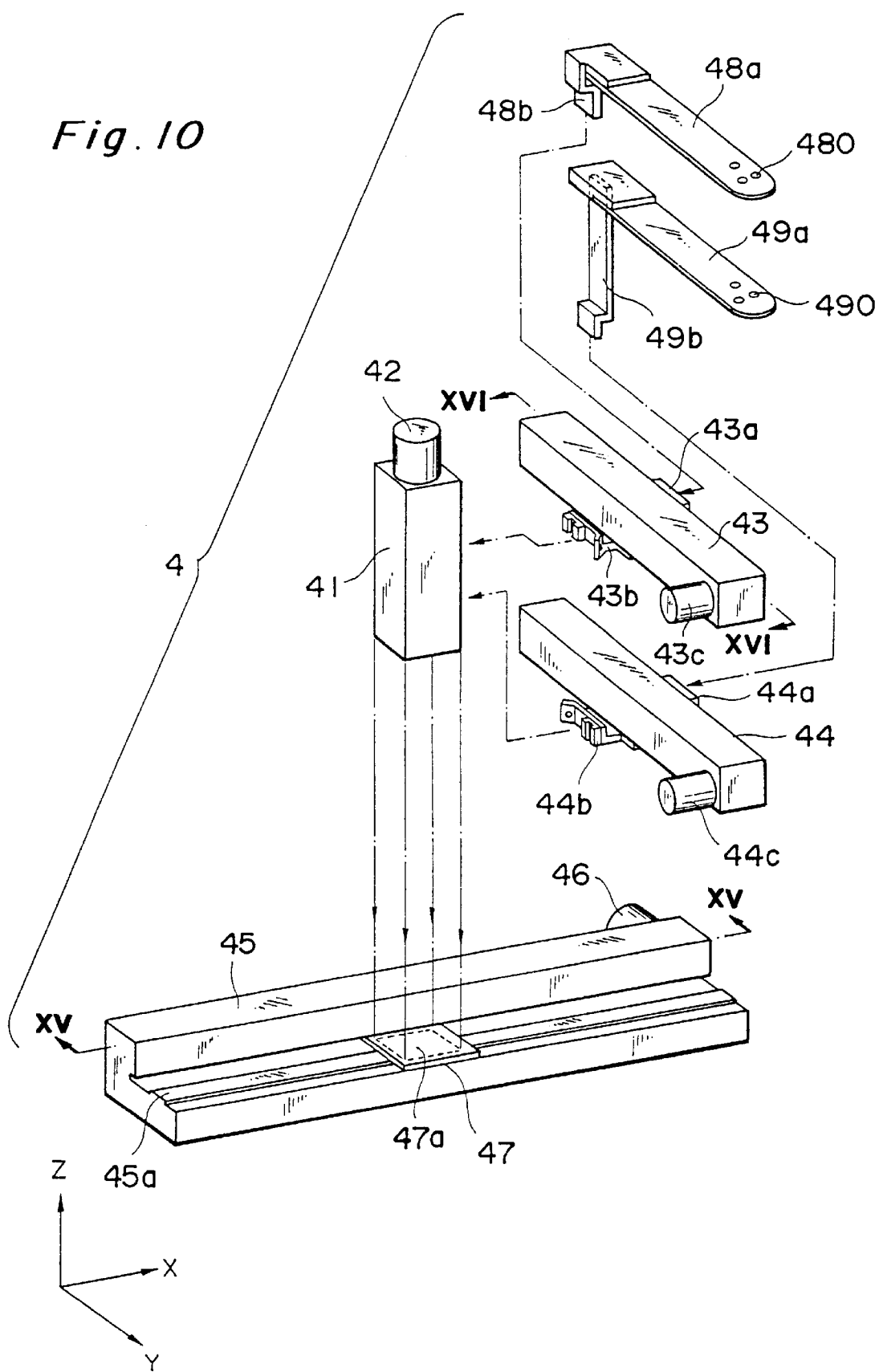
FIG. 10 is an assembly process view showing the schematic structure of the first convey system.
Figure 11:
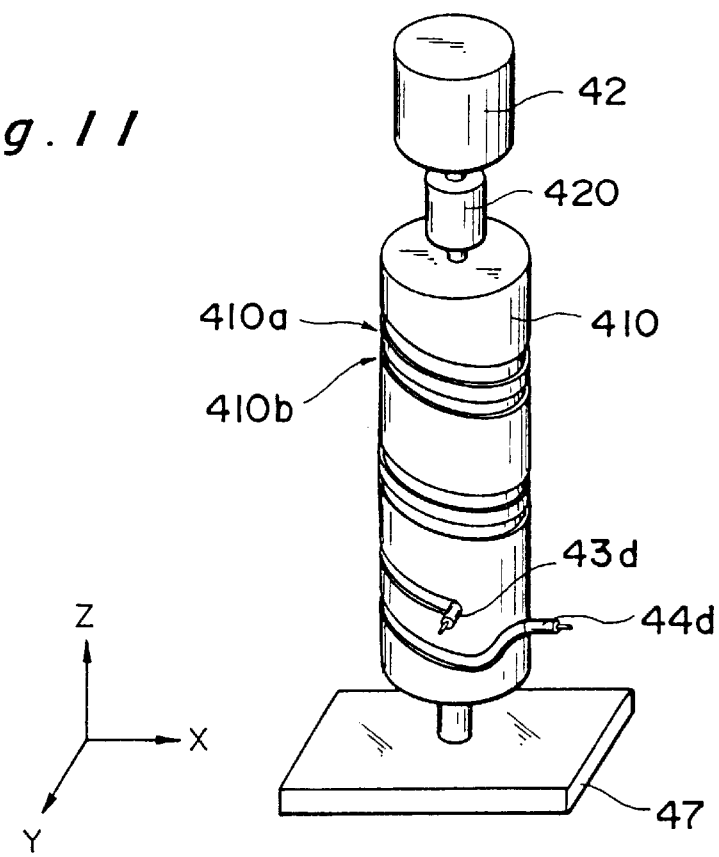
Figure 12:
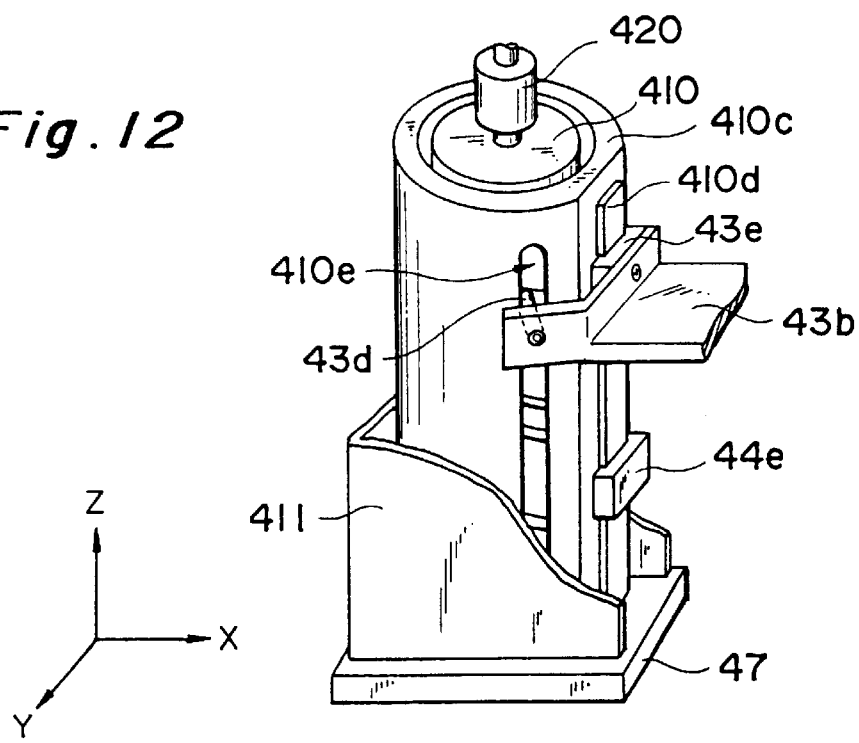
Figure 13:
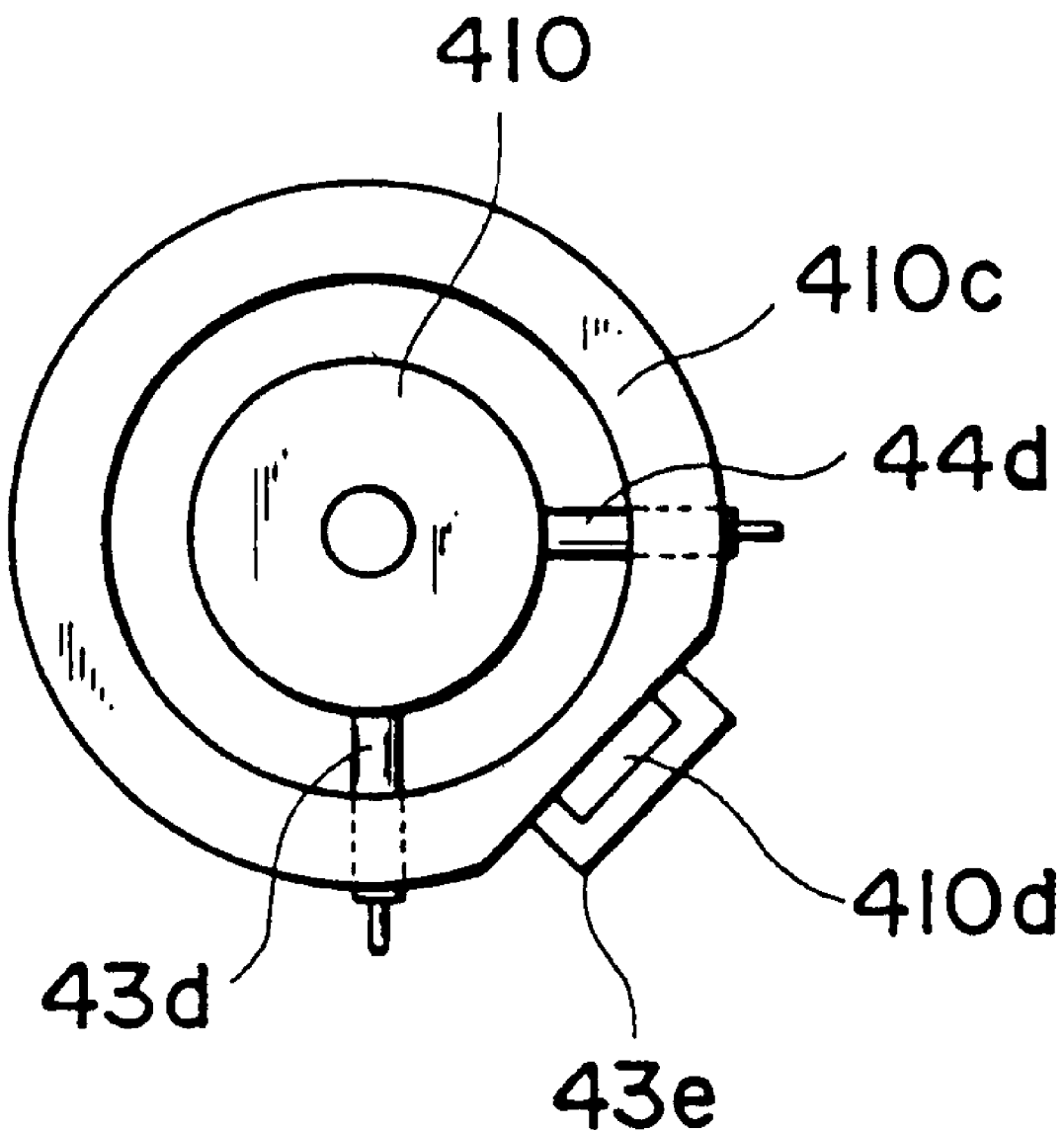
Figure 14:
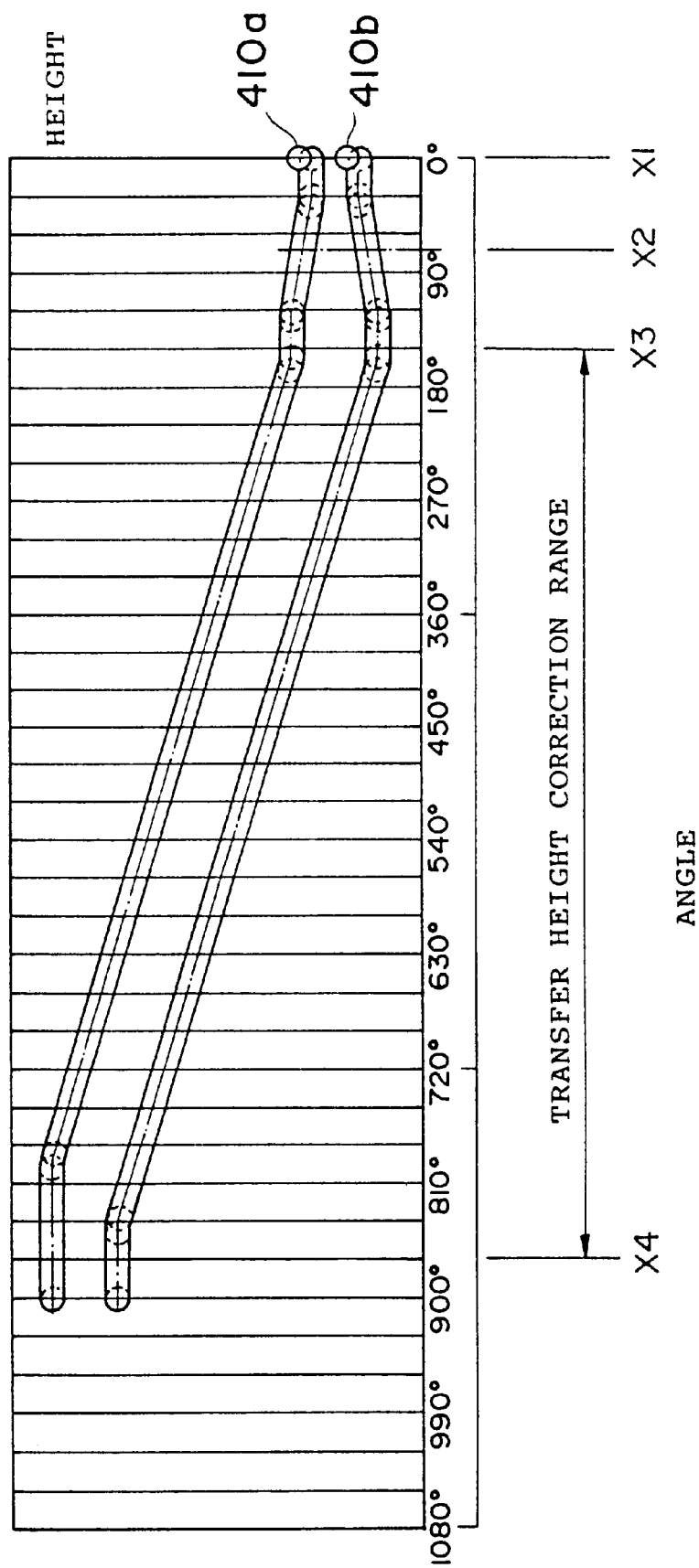
FIG. 14 is a developed plan view for explaining the shapes of guide grooves (cam grooves) formed in the cylindrical cam shown in FIG. 11.
Figure 15:
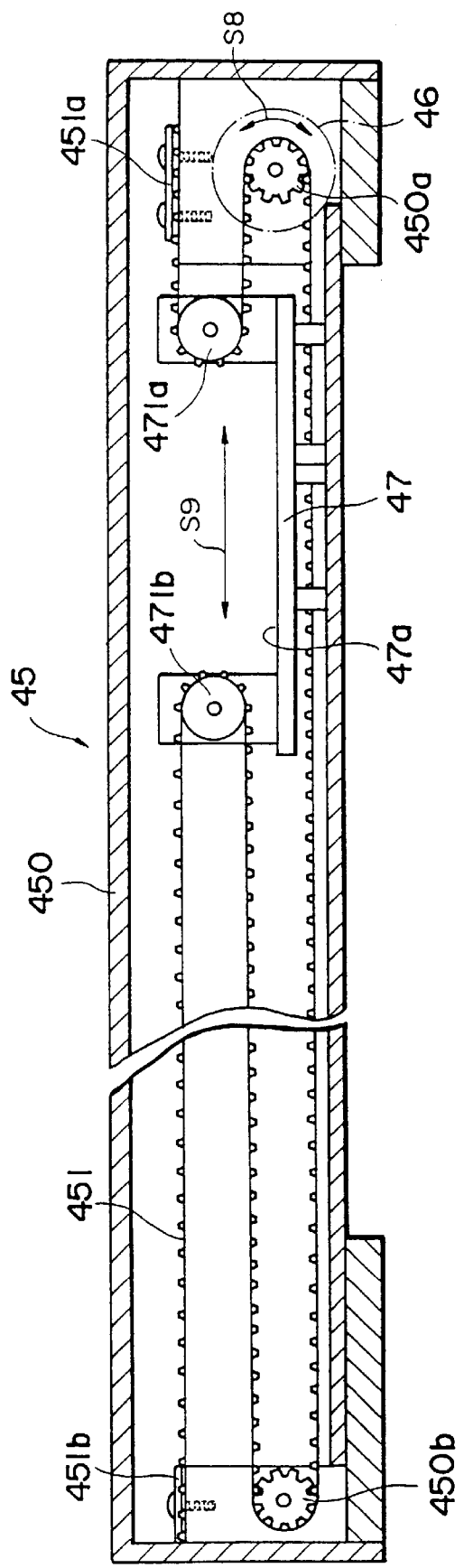
FIG. 15 is a sectional view showing the internal structure of the support table of the first convey system along the line XV—XV of FIG. 10.
Figure 16:
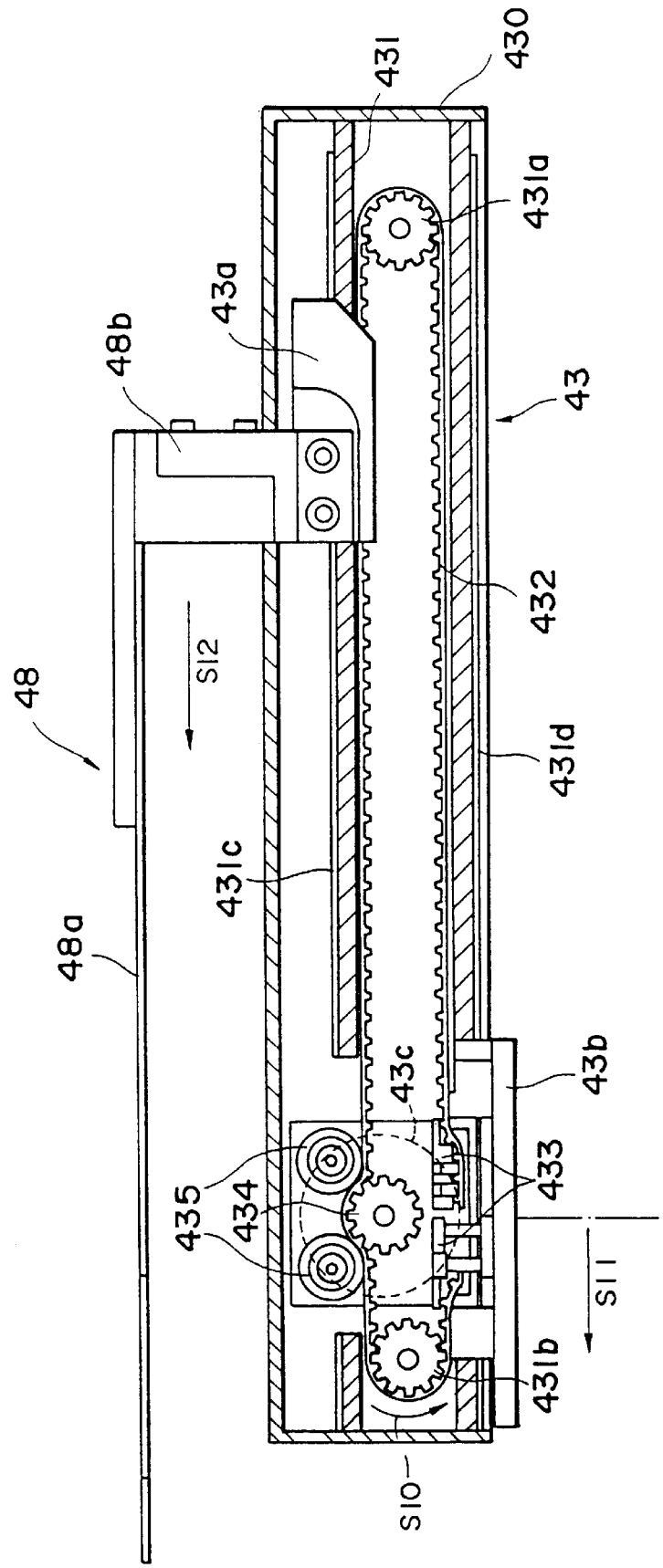
FIG. 16 is a sectional view showing the internal structure of the first arm portion of the first convey system along the line XVI—XVI of FIG. 10.

The structure of the first convey system 4 will be described with reference to FIGS. 10 to 16. FIG. 10 is an assembly process view of the first convey system 4, FIGS. 11 to 13 are views showing the major arrangement of the height correction mechanism of the first convey system 4, FIG. 14 is a developed view showing the shapes of cam grooves 410a and 410b formed in a cylindrical cam 410, and FIGS. 15 and 16 are views respectively showing the sectional structures of the support table 45 and the first arm portion 48 (the second arm portion 49 also has the same arrangement), respectively, in order to explain the driving system of the first convey system 4.

The first convey system 4 has the support table 45 having a driving system (see FIG. 15) for moving a stage 47 in the direction indicated by the arrow S3 in FIG. 2. At least, the support table 45 is covered with the cover 9. The stage 47 moves along a linear guide 45a formed on the support table 45. The support portion 41 (mounted with the driving source 42 for supplying a driving force in the direction of height) including the height correction mechanism is fixed on a major surface 47a of the stage 47 and supports the first and second arm portions 48 and 49. The first arm portion 48 is mainly constituted by a first arm head 48a (having a distal end formed with a suction port 480 for drawing the wafer 32 by vacuum suction) and a first support arm 43. The first support arm 43 is supported by the support portion 41 through a fixing member 43b, and the first arm head 48a is fixed to the first support arm 43 through a support member 48b and the fixing member 43b. The first support arm 43 itself moves relative to the support portion 41 and in parallel to the wafer convey reference surface, and has a driving mechanism (including a motor 43c) which moves the first arm head 48a relative to the first support arm 43 and in parallel to the wafer convey reference surface.

The second arm portion 49 also has an arrangement similar to that of the first arm portion 48 described above. In FIG. 10, reference numeral 49a denotes a second arm head; 490, a vacuum suction port; 49b, a support member; 44, a second support arm; and 44a, 44b, and 44c, a fixing member, a fixing member, and a motor, respectively.

In the support portion 41, the cylindrical cam 410 formed with the cam grooves 410a and 410b is attached to the motor 42 through a connecting member 420. The cylindrical cam 410 is accommodated in a support pipe 410c having an opening 410e extending in the direction of height. A linear guide 410d extending in the direction of height is provided to the side surface of the support pipe 410c. The fixing member 43b of the first support arm 43 is provided with a guide receptacle 42e engageable with the linear guide 410d, and a first pin 43d fitted in the first cam groove 410a formed in the cylindrical cam 410 is fixed to the distal end of the fixing member 43b through the opening 410e.

The second support arm 44 is also supported by the support portion 41 in the same manner as the first arm portion 48 described above. The fixing member 44b of the second support arm 44 has a guide receptacle 44e engageable with the linear guide 410d, and a pin 44d fitted in the cam groove 410b is fixed to the fixing member 44b through the opening 410e. The positions of the pins 43d and 44d relative to each other are shifted from each other by 90°, as shown in FIG. 13.

As described above, the first convey system 4 has the first and second arm heads 48a and 49a that are spaced apart from each other by a predetermined distance in the Z direction shown in FIG. 10.

The first arm head 48a is arranged above the second arm head 49a, and extracts the wafer 32 from the cassette member 3 in accordance with well-known vacuum suction and conveys it to the second convey system 5 (to be described later) (including the plurality of rotary arm portions 51a to 51c). For this purpose, the distal end portions of the arm heads 48a and 49a are formed with vacuum suction ports 480 and 490, respectively. The second arm head 49a returns the wafer 32, which has been inspected and transferred from the second convey system 5, to the cassette member 3.

A motor 46 serves to move the first and second arm heads 48a and 49a in the X direction in FIG. 10. A motor 43c serves to move the first arm head 48a in the Y direction in FIG. 10. The motor 44c serves to move the second arm head 49a in the Y direction in FIG. 10.

More specifically, the first and second arm heads 48a and 49a can move independently of each other in the Y direction (the extracting/storing directions S1 and S2 of the wafer 32).

Furthermore, the motor 42 serves to move the first and second arm heads 48a and 49a in the Z direction in FIG. 10. The driving force of the motor 42 is transmitted to the first and second arm heads 48a and 49a through the cylindrical cam 410 having the mechanism shown in FIGS. 11 to 13.

As shown in FIG. 11, the cylindrical cam 410 has the cam groove 410a for the first arm portion 48 and the cam groove 410b for the second arm portion 49. The first arm head 48a is moved in the Z direction by engaging its pin 43d with the cam groove 410a for the first arm portion 48, and the second arm head 49a is moved in the Z direction by engaging its pin 44d with the cam groove 410b for the second arm portion 49.

FIG. 14 is a developed plan view of the cam groove 410a for the first arm portion 48 and the cam groove 410b for the second arm portion 49, in which the axis of abscissa represents the angle and the axis of ordinate represents the height in the Z direction. Although FIG. 14 shows the respective cam grooves 410a and 410b on the common coordinate system, actually, since the pins 43d and 44d are shifted from each other by 90°, as shown in FIG. 13, the cam grooves 410a and 410b are also relatively shifted from each other by 90°.

In FIG. 14, a range indicated by X1 and X2 shows a stroke for extraction and storage of 4-inch to 6-inch wafers. The position X1 is where the 4-inch to 6-inch wafers are stored, and the position X2 is where the 4-inch to 6-inch wafers are extracted.

In FIG. 14, a range indicated by X2 and X3 shows a stroke for extraction and storage of an 8-inch wafer. The position X2 is where the 8-inch wafer is stored, and the position X3 is where the 8-inch wafer is extracted.

In this manner, in the range indicated by X1 to X3 in FIG. 14, the first and second arm heads 48a and 49a move in opposite directions along the Z direction (the direction of height).

As is apparent from FIGS. 1 and 9, in this apparatus, the cassette-setting position Q3 of the setting surface 2a is set at a low position (set above the power supply unit 11 and about 900 mm from the floor surface) so that the operator can easily carry and mount the cassette member 3 when exchanging it. Also, a finder optical system 72 of the microscope is set at a high position (the position of the finder optical system 72 and about 1,200 mm from the floor surface) so that the operator can easily perform microscopic observation. In other words, the cassette-setting position Q3 of the setting surface 2a of the cassette member 3 is set at a low position with respect to the microscopic observation reference surface 741 corresponding to the position Q5 (see FIG. 9).

Therefore, a transfer height correction range is provided in each of the cam groove 410a of the first arm portion 48 and the cam groove 410b of the second arm portion 49 in order to correct the height difference between the cassette member 3 and the microscopic observation system 7.

As described above, the conventional wafer inspection apparatus has a microscopic observation system at a height where the operator can easily perform microscopic observation. For this reason, the cassette member set on the same plane as the observation reference surface for microscopic observation becomes undesirably high from the floor surface. When the operator is to exchange this cassette member, he must lift the cassette member to a high position, requiring much labor. This problem particularly largely depends on the physical constitution of the operator.

However, in this wafer inspection apparatus, since the cassette member is provided at a position (the cassette-setting position Q3 of the setting surface 2a) lower than the observation reference surface 741 of this apparatus, the operator need not lift the cassette member 3 high when exchanging the cassette member 3. Accordingly, the cassette member 3 can be exchanged easily without requiring much labor.

In this apparatus, since the wafer is conveyed while the height correction mechanism corrects the height difference between the cassette member 3 and the observation systems 6 and 7, an extra time is not required for correcting the height difference between the cassette member 3 and the observation systems 6 and 7. Therefore, the height difference between the cassette member 3 and the observation systems 6 and 7 can be corrected without decreasing the throughput of the wafer inspection apparatus.

Furthermore, since this wafer inspection apparatus conveys the wafer from the cassette member 3 to the respective observation systems 6 and 7 with the first and second convey systems 4 and 5, the wafer can be conveyed efficiently.

This first convey system 4 can be applied to other apparatuses, e.g., an exposure apparatus.

The driving mechanism of the support table 45 for moving the support portion 41 along the arrow S3 in FIG. 2 and the driving mechanism for moving the first arm portion 48 relative to the support portion 41 will be described with reference to FIGS. 15 and 16, respectively. FIG. 16 shows the sectional structure of the first arm portion 48 in order to avoid repetitive explanation.

As shown in FIG. 15, part of the stage 47 for moving the support portion 41 by loading the support portion 41 on its major surface 47a is accommodated in a housing 450 of the support table 45. One end of a driving belt 451 is fixed to a predetermined position in the housing 450 with a fixing member 451a. The other end of the driving belt 451 is fixed on the opposite side to the fixing member 451a provided in the housing 450 with a fixing member 451b through gears 450a, 450b, and 471b. The gear 450a is mounted at a predetermined position in the housing 450 and connected to the motor 46. The gear 450b is mounted on the opposite side to the gear 450a provided in the housing 450. The gear 471b is provided to the stage 47. With this arrangement, when the motor 46 rotates in a direction indicated by an arrow S8 in FIG. 15, the stage 47 moves in a direction indicated by an arrow S9 in FIG. 15. As a result, the support portion 41 fixed on the major surface 47a of the stage 47 moves in a direction indicated by the arrow S3 in FIG. 2.

The first arm portion 48 includes the support arm 43 and the arm head 48a, as shown in FIG. 16. The support arm 43 has an inner housing 431 accommodated in a case 430. Linear guides 431c and 431d are provided on the outer side surface of the inner housing 431. Gears 431a and 431b on which a driving belt 432 is wound are mounted at predetermined positions in the inner housing 431. In particular, the gear 434 is connected to the motor 43c so that it is directly driven by the motor 43c. The two ends of the driving belt 432 are fixed to the fixing member 43b supported on the support portion 41 with fixing members 433. The inner housing 431 is also supported by the fixing member 43b, and the driving belt 432 is prevented from flexing by a gear 434 and rollers 435 mounted in the fixing member 43b.

With this arrangement, when the gear 431b is rotated by the motor 43c (in a direction indicated by an arrow S10 in FIG. 16), the driving belt 432 is pulled relative to the fixing member 43b in a direction indicated by an arrow S11 in FIG. 16, so that the entire support arm 43 slides on the fixing member 43b along the linear guide 431d. In other words, the entire support arm 43 moves relative to the support portion 41 in the direction indicated by the arrow S11.

A fixing member 43a on which the arm head 48a is directly mounted through the support member 48b is fixed on the driving belt 432. Accordingly, when the driving belt 432 is pulled in the direction indicated by the arrow S11 as described above, the fixing member 43a also moves together with the driving belt 432 along the linear guide 431c. Upon movement of the fixing member 43a, the arm head 48a also moves in a direction indicated by an arrow S12 in FIG. 16.

The second arm portion 49 also has the same structure as that shown in FIG. 16, excluding the shape of its support member 49b.

In the next-stage second convey system 5, its first to third rotary arm portions 51a to 51c mounted on the distal end of the support shaft 50 are rotatable counterclockwise, and a detailed description thereof will be made later.

At a position A1 in FIG. 2, any one of the plurality of rotary arm portions 51a to 51c receives the conveyed wafer 32 from the first arm head 48a, or transfers the inspected wafer 32 to the second arm head 49a.

At a position B1 in FIG. 2, any one of the rotary arm portions 51a to 51c transfers the conveyed wafer 32 to the macro observation system 6, or receives the inspected wafer 32 from the macro observation system 6. Macro observation is a process of observing a defect, e.g., a scratch, of the wafer through visual observation of the operator. The detailed structure of the driving system of the macro observation system 6 will be described later.

At a position C1 in FIG. 2, any one of the rotary arm portions 51a to 51c transfers the conveyed wafer 32 to the microscopic observation system 7, or receives the inspected wafer from the microscopic observation system 7.

The microscopic observation system 7 serves to microscopically observe the wafer 32, and objective lenses having various magnifications can be attached to it. The structure of the X–Y stage 71 for loading the wafer 32 thereon and setting the wafer 32 at a predetermined observation position will be described later.

Figure 17:
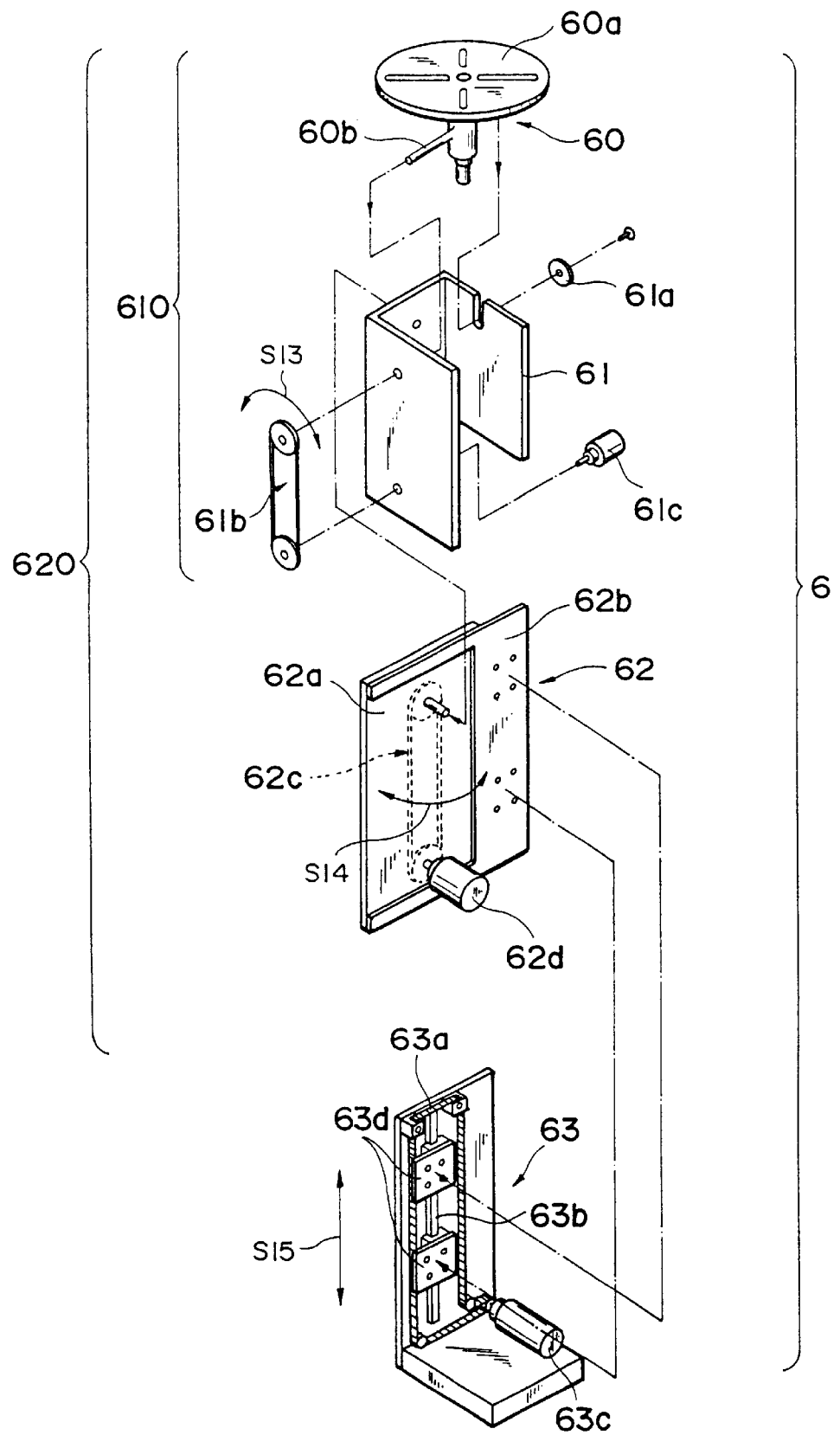
FIG. 17 is an assembly process view for explaining the schematic structure and operation of a macro observation system.

FIG. 17 shows the assembly process of the driving system of the macro observation system 6. Referring to FIG. 17, in a wafer stage 60 having a rotary shaft 60b, the two ends of the rotary shaft 60b are attached to a support member 61 through a fixing metal fixture 61a and one pulley of a belt mechanism 61b. The wafer 32 serving as the inspection target is set on a main surface 60a of the wafer stage 60. The other pulley of the belt mechanism 61b is interlocked with a motor 61c, thereby constituting a first driving portion 610 which swings the main surface 60a of the support member 61 in a direction indicated by an arrow S13 in FIG. 17 when the belt mechanism 61b is driven by the motor 61c.

The first driving portion 610 is mounted on a support member 62a having a motor 62d and a belt mechanism 62c, thereby constituting a second driving member 620 which swings the entire first driving portion 610 in a direction indicated by an arrow S14 in FIG. 17. A reinforcing member 62b is mounted on the support member 62a.

The second driving member 620 is mounted on a support member 63 as it is fixed to moving members 63d engaging with a linear guide 63b. As the moving members 63d are interlocked with a motor 63c through a driving belt 63a, the entire second driving member 620 can move in a direction indicated by an arrow S15 in FIG. 17.

The driving system of the macro observation system 6 having the above arrangement realizes the operation of the wafer stage 60 which includes directional components indicated by the arrows S13 to S15 in FIG. 17.

Figure 18:
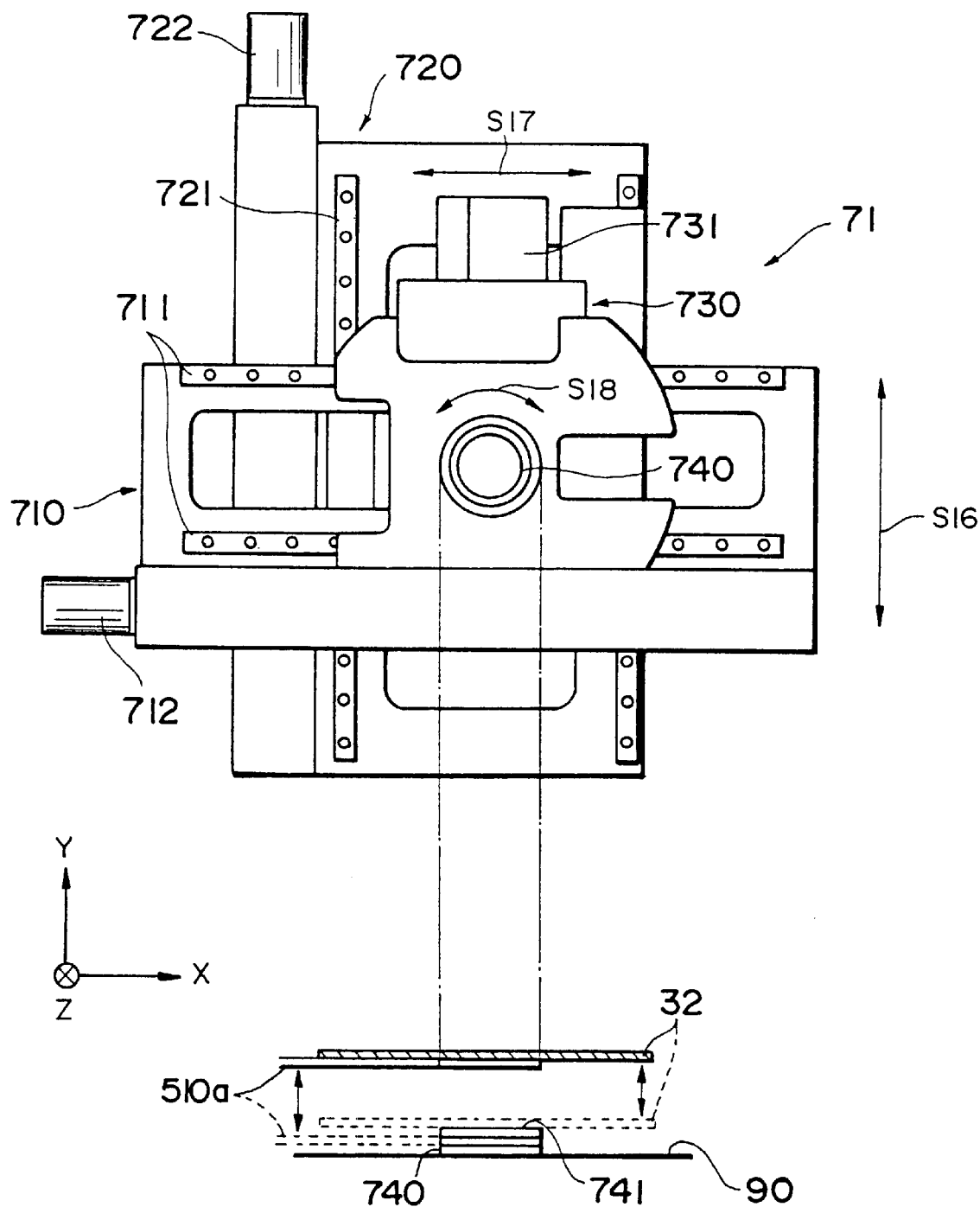
FIG. 18 is a plan view showing the structure of an X–Y stage.

FIG. 18 shows the structure of the X–Y stage 71 of the microscopic observation system 7. The X–Y stage 71 has a Y stage 720, an X stage 710, and a rotary stage 730. The Y stage 720 moves a holder 740 having a wafer setting surface 741 (observation reference surface), on which the wafer 32 as the inspection target is set, in a direction (Y direction) indicated by an arrow S16 in FIG. 18. The X stage 710 is set on the Y stage 720 and moves the holder 740 in a direction indicated by an arrow S17 of FIG. 18. The rotary stage 730 rotates the holder 740 in a direction indicated by an arrow S18 in FIG. 16.

More specifically, in order to move the X stage 710 in the direction indicated by the arrow S16, the Y stage 720 has a linear guide 721 and a motor 722 that drives the X stage 710. In order to move the rotary stage 730 in the direction indicated by the arrow S17, the X stage 710 has a linear guides 711 and a motor 712 that drives the rotary stage 730. The rotary stage 730 has a motor 731 that rotates the holder 740 in the direction indicated by the arrow S18. As a while, the wafer 32 mounted on the main surface 741 of the holder 740 can be moved in a direction indicated by an arrow S7 shown in FIG. 2.

The rotary arm head (for example, first rotary arm head 510a) is movable upward and downward. Upon upward or downward movement of the rotary arm head, the wafer 32 conveyed by the second convey system 5 is transferred to or received from the rotary arm portion 51a (51b or 51c).

The operation of the wafer inspection apparatus according to the present invention and having the above arrangement will be described.

Figure 19:
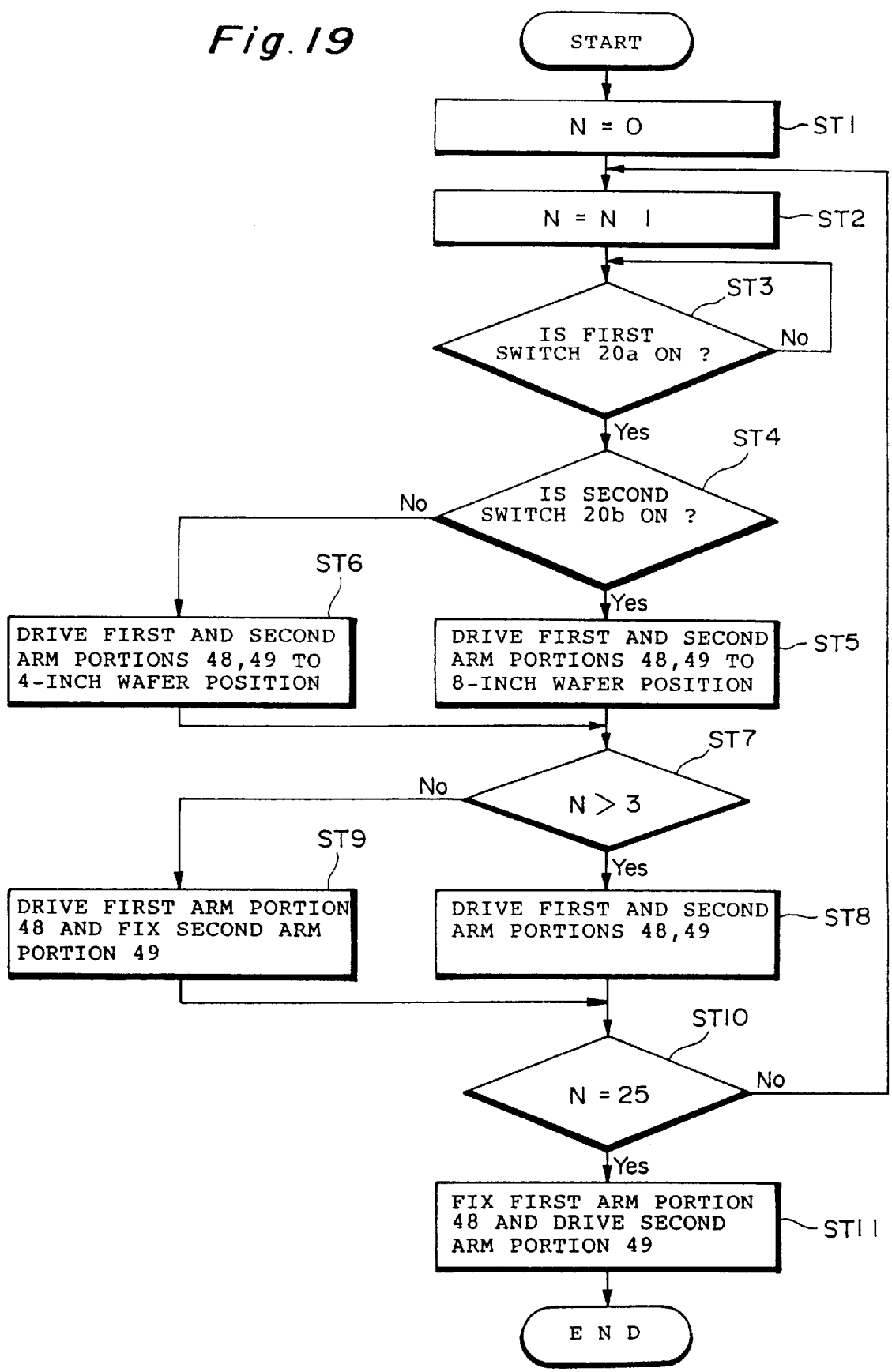
FIG. 19 is a flow chart for explaining the wafer convey operation of the first convey system.

FIG. 19 is an operation flow chart of the main controller 10 concerning conveyance of the wafer 32. An explanation will be made with reference to this flow chart.

In the following description, twenty-five 4-inch wafers 32 are stored in the cassette member 3.

The main controller 10 sets a variable N representing the number of wafers stored in the cassette member 3 to 0 (step ST1), and increments the variable N representing the number of wafers by 1 (step ST2).

Subsequently, the main controller 10 determines whether the first switch 20a outputs an ON signal, i.e., whether a 4-inch wafer cassette is mounted on the lifting unit 2 (step ST3). The main controller 10 continues the operation state of ST3 until the first switch 20a outputs an ON signal, and performs a subsequent step after receiving an ON signal from the first switch 20a.

Upon reception of an ON signal from the first switch 20a, the main controller 10 determines whether the second switch 20b (second detector) outputs an ON signal. If Yes, the main controller 10 performs step ST5. If No, the main controller 10 performs step ST6 (step ST4).

In this embodiment, since the cassette member 3 stores the 4-inch wafers as described above, the second switch 20b does not output an ON signal. Therefore, step ST6 is performed by the main controller 10.

As described above, since the height of the cassette member 3 (the height of the space for storing the wafers) is the same for the 4-inch to 6-inch wafer cassettes, the step of discriminating the 4-inch to 6-inch wafers is omitted in this embodiment.

From the determination results of steps ST3 and ST4, the main controller 10 determines that the wafer 32 as the inspection target is a 4-inch wafer (not an 8-inch wafer), and adjusts the positions of the arm portions 48 and 49 in the Z direction of the first convey system 4 to correspond to the cassette member 3 for storing 4-inch wafers (step ST6). More specifically, the main controller 10 controls the first convey system 4 to move the first and second arm portions 48 and 49 to the position X1 of FIG. 14, and the first arm portion 48 extracts the wafer 32 from the cassette member 3 (see FIG. 20). When inspecting an 8-inch wafer, the main controller 10 moves the first and second arm portions 48 and 49 to the position X2 of FIG. 14 in step ST5.

Subsequently, the main controller 10 determines whether the number of wafers 32 conveyed by the first arm portion 48 is larger than 3 (reaches 4). If Yes (if the number of conveyed wafers reaches 4), the main controller 10 performs step ST8; if No, the main controller 10 performs step ST9

(step ST7). Sine the second convey system 5 has at least three rotary arm portions 51a to 51c, the wafers 32 need not be stored with the second arm portion 49 until the third wafer (the second arm portion 49 need not be moved in the Y direction). Step ST7 is provided for this reason.

When the count of wafers 32 conveyed by the first arm portion 48 is three or less, the main controller 10 does not drive the second arm portion 49 but drives only the first arm portion 48 to transfer the wafer 32 to any one of the rotary arm portions 51a to 51c (step ST9), and determines whether the number of conveyed wafers 32 reaches 25 (step ST10). If No, the main controller 10 sequentially performs the operations described above again starting from step ST2. If Yes, the main controller 10 performs the operation of the subsequent step.

When the variable N representing the number of wafers 32 is 4 in step ST7, the main controller 10 controls the second arm portion 49 to receive the first conveyed wafer 32 which has been inspected by the microscopic observation system 7 from any one of the rotary arm portions 51a to 51c, and stores this wafer 32 in the cassette member 3. At the same time, the main controller 10 controls the first arm portion 48 to extract a new, fourth wafer 32 from the cassette member 3 and transfer it to any one of the rotary arm portions 51a to 51c (described above) that has transferred the first wafer 32, and performs the operation of step ST10 (step ST8).

The main controller 10 sequentially repeats the above steps until it determines that the variable N representing the number of wafers 32 becomes 25 in step ST10, thereby storing the wafers 32 in the cassette member 3 and extracting the wafers 32 from the cassette member 3. When the main controller 10 determines in step ST10 that the variable N representing the number of wafers 32 is 25, it determines that all the wafers 32 in the cassette member 3 are extracted, stops driving of the first arm portion 48 in the subsequent operation, drives only the second arm portion 49 to sequentially receive the inspected wafers 32 from the rotary arm portions 51a, 51b, and 51c that convey the wafers 32, and stores them in the cassette member 3 (see FIG. 21).

When all the inspected wafers 32 are stored in the cassette member 3, the main controller 10 ends the processing operation of this flow chart.

In this embodiment, whether the size of the wafer 32 of 8 inch is determined from the cassette member 3 mounted on the lifting unit 2. However, detectors for 5-inch wafers and 6-inch wafers may be provided to discriminate 4-inch to 6-inch wafers.

Figure 20:
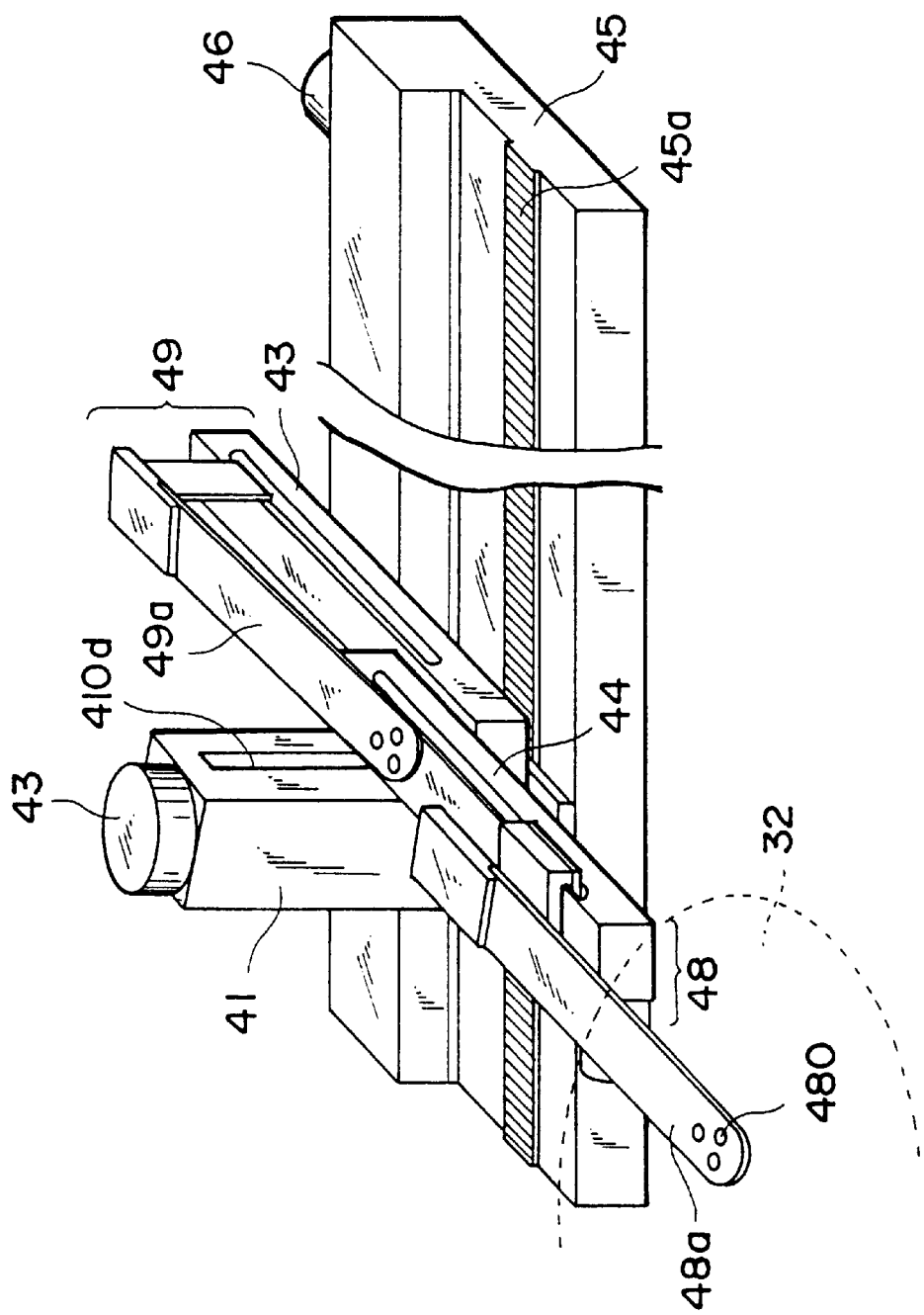
FIGS. 20 and 21 are perspective views for explaining the idea of the wafer convey operation of the first convey system.
Figure 21:
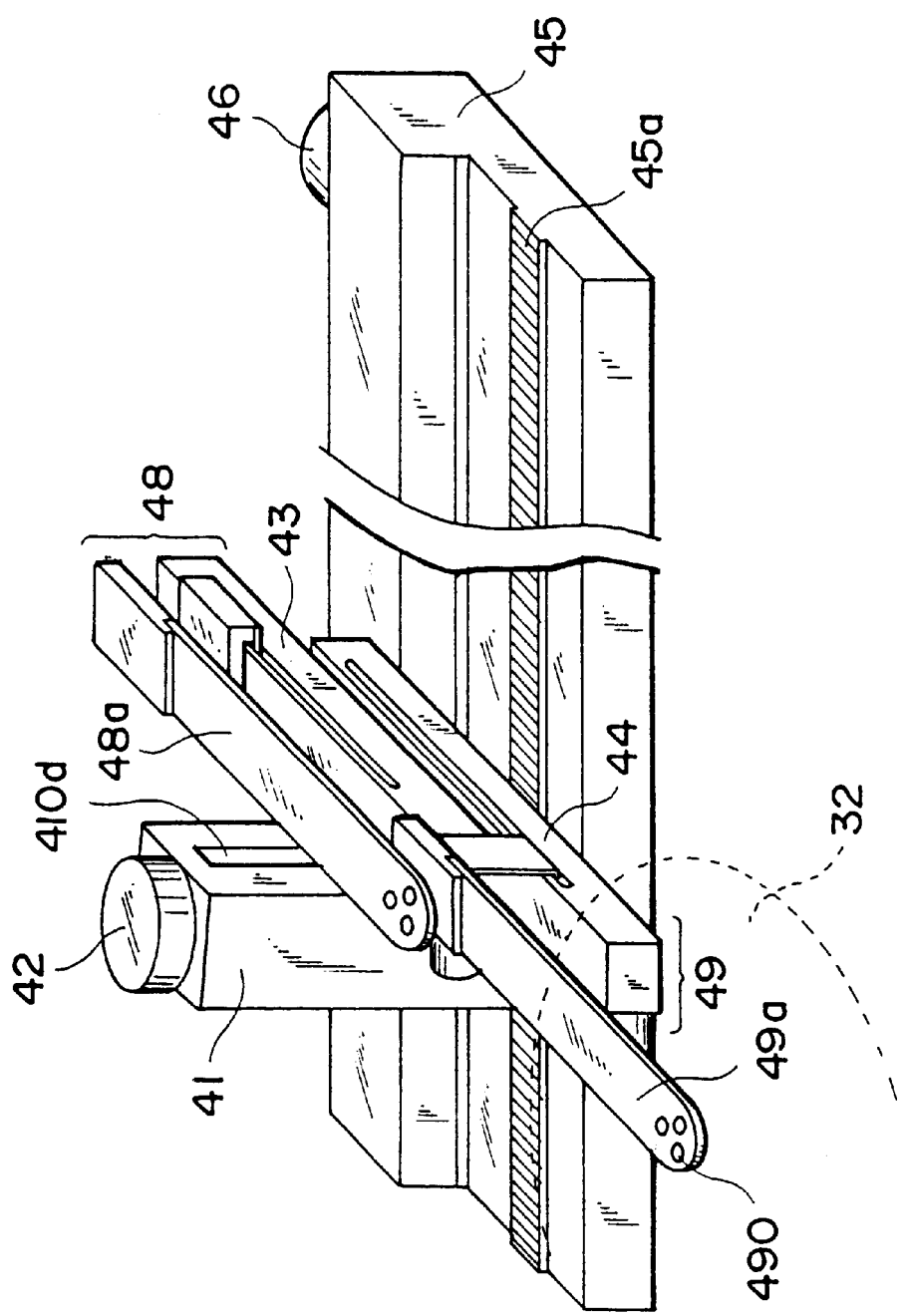

FIGS. 20 and 21 are schematic views respectively showing an operation of the first arm portion 48 to extract the wafer 32 and an operation of the second arm portion 49 to store the wafer 32.

As has been described above, since the driving mechanism of the first convey system 4 drives the first and second arm portions 48 and 49 independently of each other in the direction of height, the wafer can be extracted from and stored in the cassette member 3 having a predetermined size almost simultaneously. As a result, the convey time of the wafer 32 can be greatly shortened.

Also, since the main controller 10 of the first convey system 4 controls the driving system of the first convey system 4 in accordance with the size of the wafer 32, the wafer 32 can be safely conveyed without any failure or damage.

Figure 22:
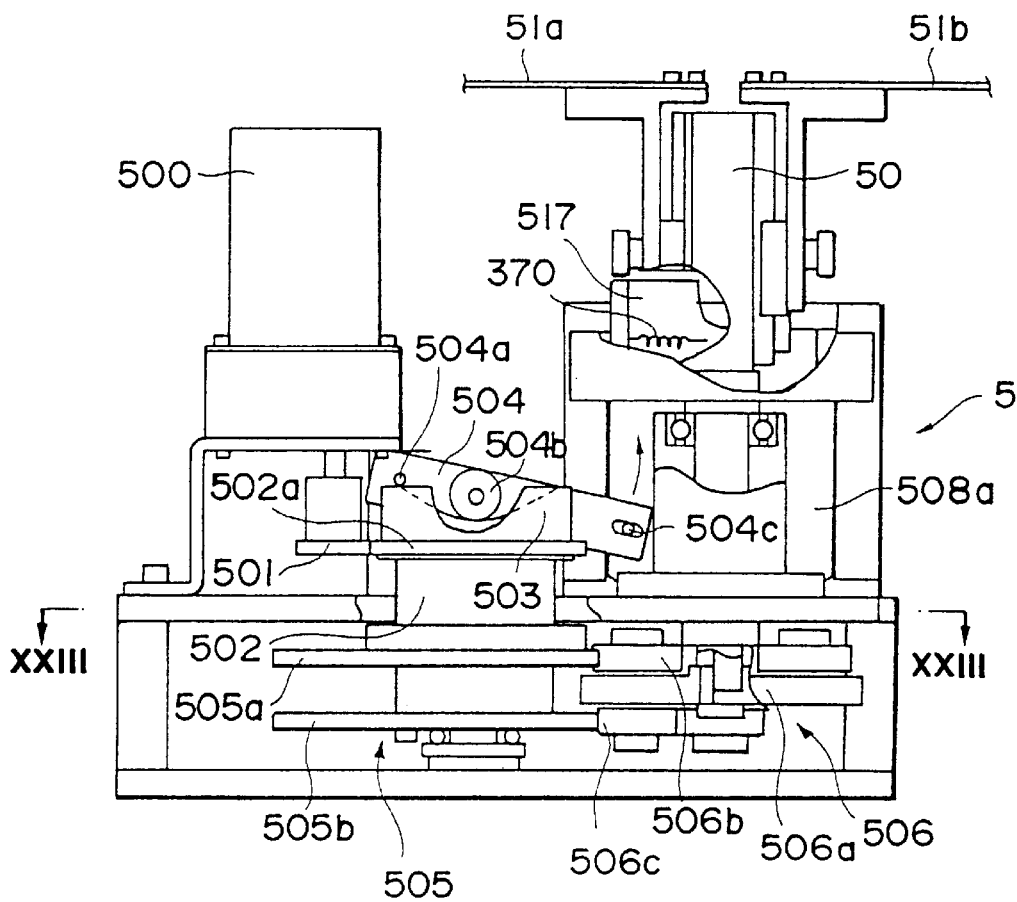
FIG. 22 is a side view showing the schematic structure of a cam mechanism for driving the second convey system.

The structure of the second convey system 5 will be described with reference to FIGS. 22 to 26. FIGS. 22 and 24 are views showing the entire structure of the second convey system 5. As shown in FIGS. 22 and 24, the second convey system 5 has a driving motor 500.

A gear 501 is mounted on the driving motor 500. The gear 501 engages with a gear 502a mounted on a rotary shaft 502 to rotate the rotary shaft 502 with the driving force of the driving motor 500. An annular cam 503 is fixed at the upper portion of the rotary shaft 502. The end face of the annular cam 503 is partially recessed, and this end face is in contact with a roller 504b mounted on a connecting shaft 504 having one end fixed to a shaft 504a. Intermittent cams 505a and 505b are mounted under the rotary shaft 502 to constitute a driving cam mechanism 505. A driven cam mechanism 506 to engage with the driving cam mechanism 505 is provided.

The driven cam mechanism 506 has a disk 506a having a center to which one end of the support shaft 50 is fixed. The plurality of rotary arm portions 51a to 51c are mounted on the other end of the support shaft 50. The support shaft SO supports the rotary arm portions 51a to 51c and integrally rotates them. Bearings 506b and 506c are disposed on the upper and lower surfaces, respectively, of the disk 506a. The disk 506a and the bearings 506b and 506c constitute the driven cam mechanism 506.

Furthermore, a stepped cam 517 through which the support shaft 50 extends is located above the driven cam mechanism 506, and a projection 504c for engaging with the other end of the connecting shaft 504 is formed on an annular support member 508a that supports the stepped cam 517. The position of the support shaft 50 in the direction of height is regulated by a bearing 508.

Figure 25:
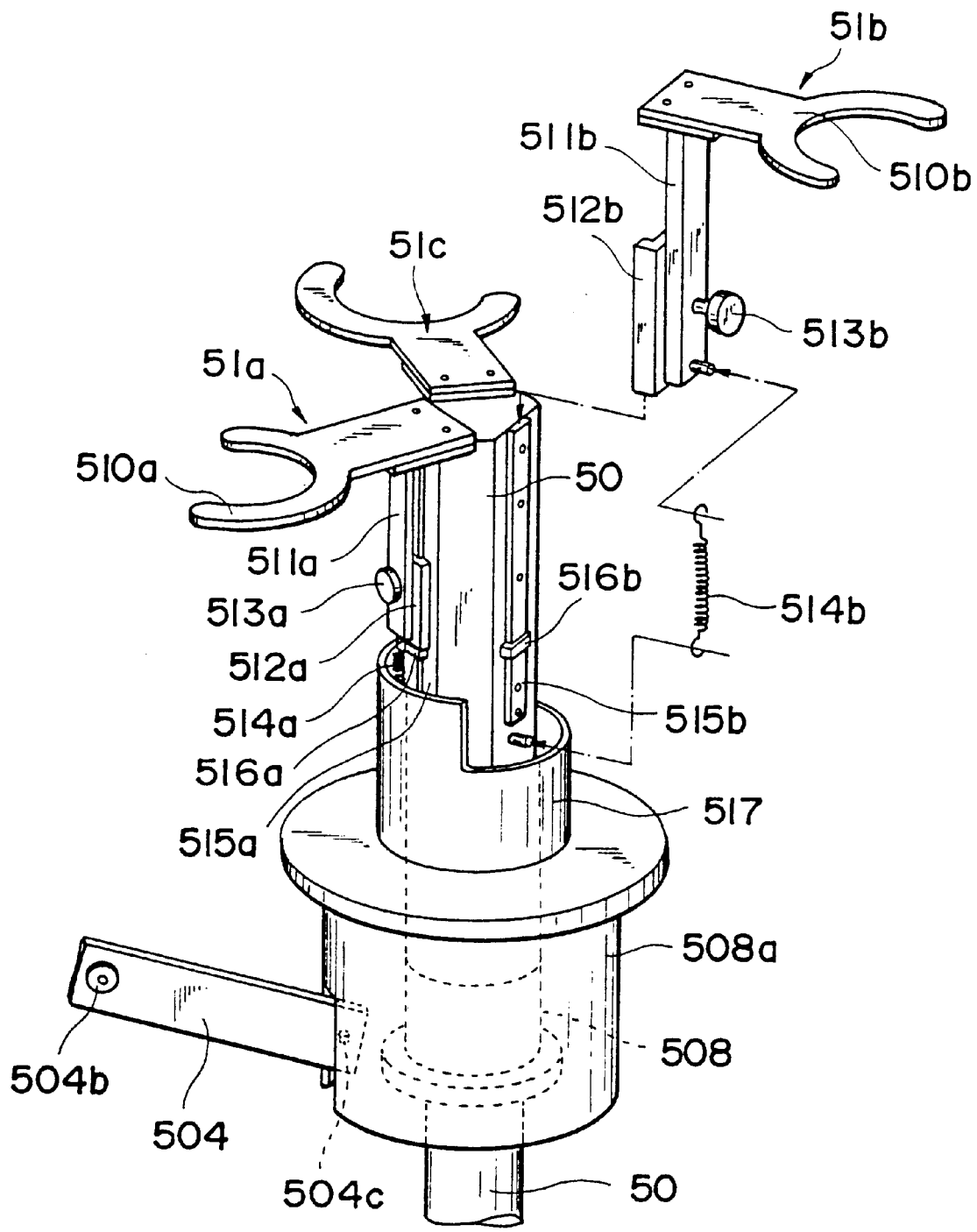
FIG. 25 is an assembly process view for explaining the structure of the upper portion of the second convey system.

FIG. 25 is an assembly process view showing the arrangement of a portion of the second convey system 5 that directly concerns wafer conveyance. As seen from FIG. 25, the first to third rotary arm portions 51a to 51c are slidably mounted on the distal end portion of the support shaft 50. More specifically, the second rotary arm portion 51b is constituted by a rotary arm head 510b, a support member 511b, and a guide receptacle 512b. The rotary arm head 510b supports the wafer 32 as the inspection target. The support member 511b supports the rotary arm head 510b. The guide receptacle 512b is fixed to the support member 511b and engages with a linear guide 515b. The linear guide 515b is provided with a stopper 516b for regulating the lower limit position of the second rotary arm portion 511b in the direction of height. In order to set the position of the stopper 516b as the reference position, an elastic member 514b, e.g., a spring, is attached between the support member 511b of the second rotary arm portion 51b and the support shaft 50. A roller 513b brought into contact with the end face of the stepped cam 517 is mounted on the support member 51b of the second rotary arm portion 51b.

The first rotary arm portion 51a has the same structure as that of the second rotary arm portion 51b and is mounted on the distal end portion of the support shaft 50. Referring to FIG. 25, reference numeral 510a denotes a rotary arm head 510a; 511a, a support member; 512a, a guide receptacle; and 513a, a roller; 514a, an elastic member; 515a, a linear guide; and 516a, a stopper. The third rotary arm portion. 51c has the same structure as that of the second rotary arm portion 51b described above and is mounted on the distal end portion of the support shaft 50. However, the members constituting the third rotary arm portion 51c are not shown.

More specifically, the annular cam 503 has a cam portion constituted by a flat portion and an inclined portion and serves to vertically move the first to third rotary arm portions 51a to 51c. The roller 504b comes into contact with the cam portion of the annular cam 503.

The connecting shaft 504 is provided with the roller 504b. One end of the connecting shaft 504 is fixed to the shaft 504a and the other end thereof engages with the projection 504c of the annular support member 508a through an elongated hole formed in the connecting shaft 504. The connecting shaft 504 rotates about the shaft 504a as the fulcrum in a direction indicated by an arrow S22 in FIG. 26 along the flat and inclined portions of the annular cam 503.

More specifically, when the rotation force (in a direction indicated by an arrow S19 in FIG. 24) of the motor 500 is transmitted to the annular cam 503, the connecting shaft 504 rotates in the above manner along the cam portion of the annular cam 503 that rotates in a direction indicated by an arrow S20 in FIG. 24.

The intermittent cams 505a and 505b are provided under the rotary shaft 502 and are rotated together with the annular cam 503 by the rotation force of the motor 500.

Figure 23:
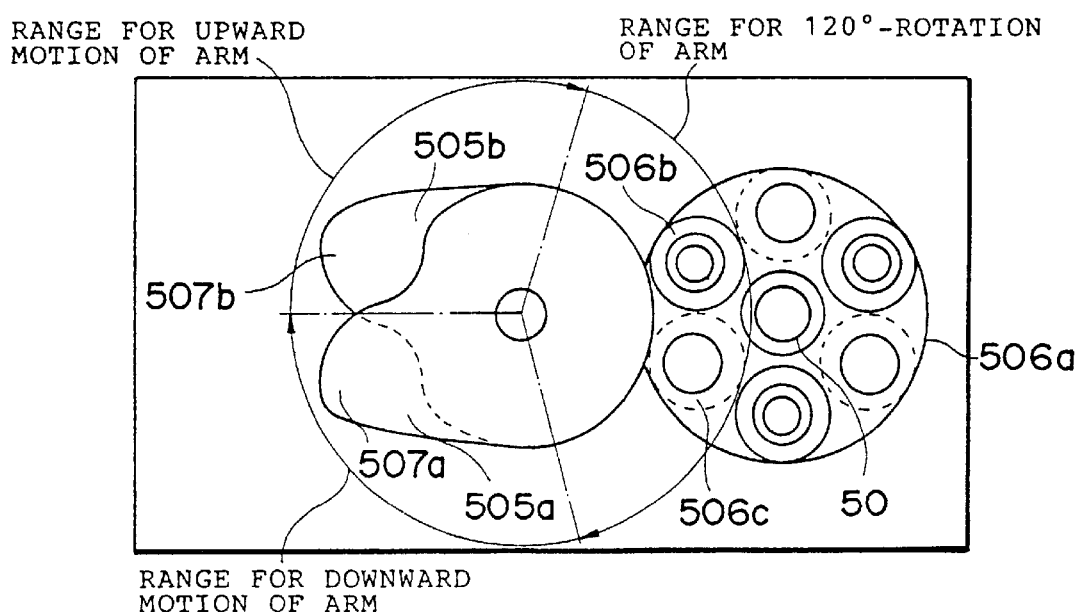
FIG. 23 is a view showing the structure of the cam mechanism along the line XVIII—XVIII of FIG. 22.
Figure 24:
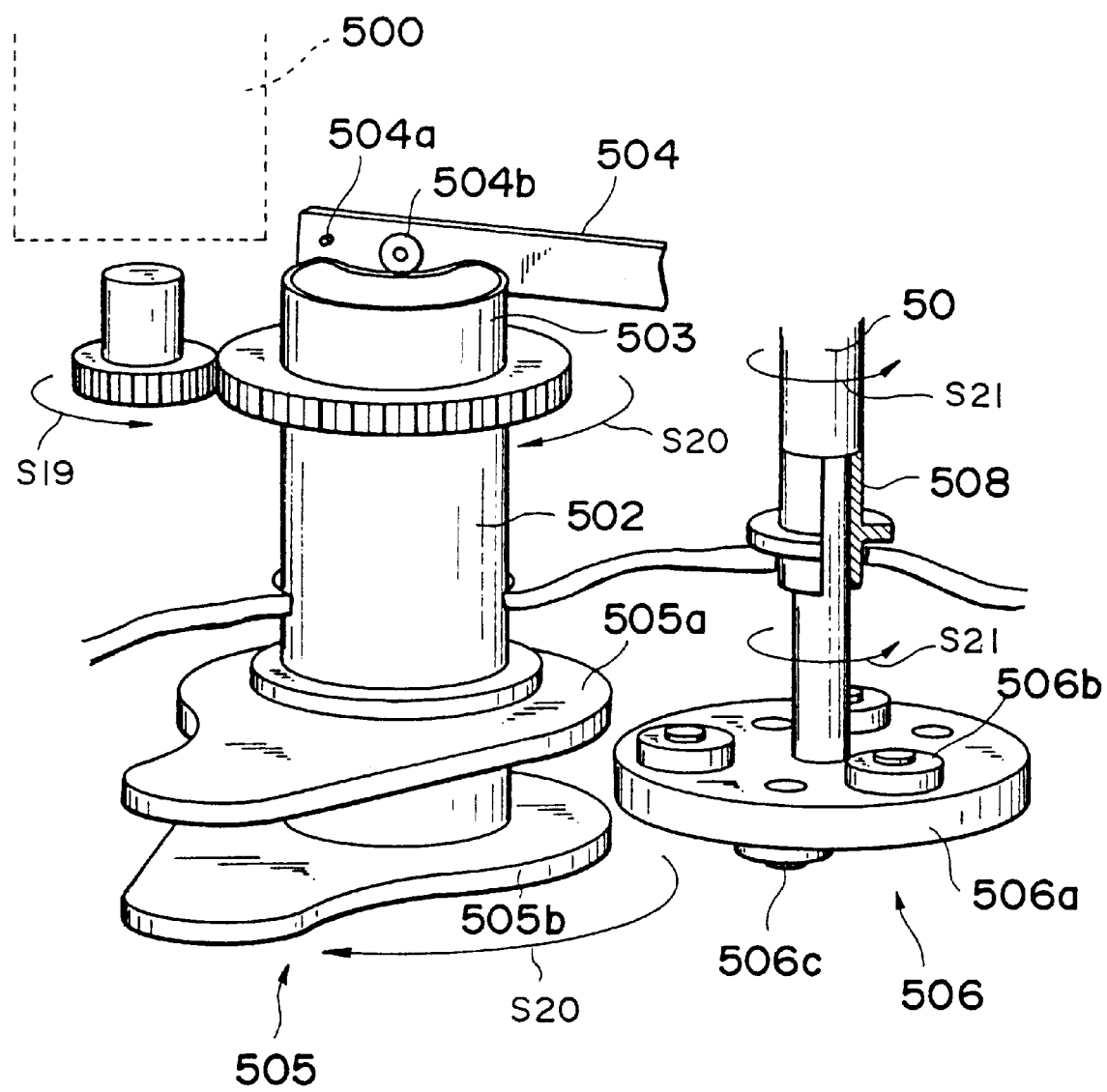
FIG. 24 is a view for explaining the idea of the operation of the cam mechanism shown in FIG. 23.

FIG. 23 is a sectional view taken along the line E—E of FIG. 22 and shows the intermittent cams 505a and 505b in a planar manner.

As shown in FIG. 23, a distal end portion 507a of the intermittent cam 505a rotates the support shaft 50, to which the first to third rotary arm portions 51a to 51c are mounted, in a direction indicated by an arrow S21 in FIG. 24 when the distal end portion 507a comes into contact with the bearings 506b.

Similarly, a distal end portion 507b of the intermittent cam 505b rotates the support shaft 50, to which the first to third rotary arm portions 51a to 51c are mounted, in the direction indicated by the arrow S21 in FIG. 24 when the distal end portion 507b comes into contact with the bearings 506c.

More specifically, the first to third rotary arm portions 51a to 51c are integrally rotated by rotation of the support shaft 50.

The stepped cam 517 is a member having two levels and is constituted by an upper surface portion, a lower surface portion, and a boundary surface as the boundary of the upper and lower surface portions. The stepped cam 517 is vertically moved by the connecting shaft 504, and is in contact with the rollers (bearing portions) 513a and 513b of the first to third rotary arm portions 51a to 51c (the third rotary arm portion 51c is not shown) when it is located at a predetermined height, as will be described later.

The stepped cam 517 is not rotated by rotation of the support shaft 50.

Figure 26:
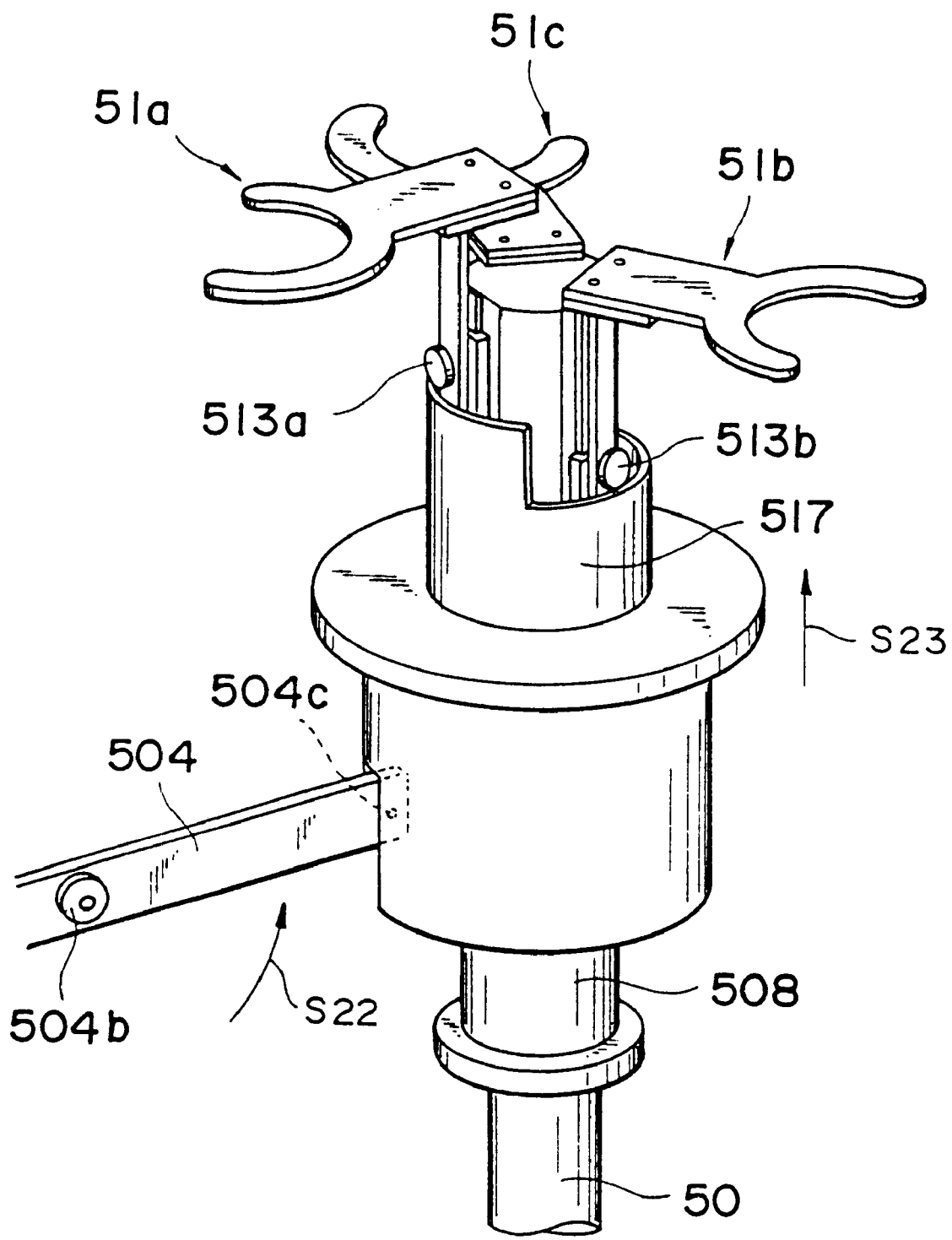
FIG. 26 is a view for schematically explaining a structure that realizes vertical motion of the rotary arms of the second convey system.
Figure 27A:
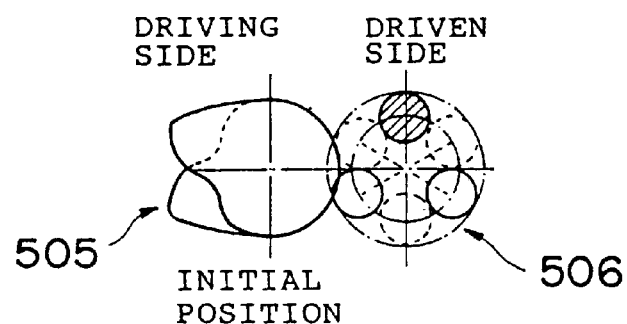
Figure 27B:
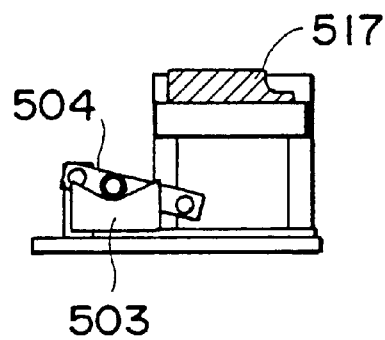
Figure 28A:
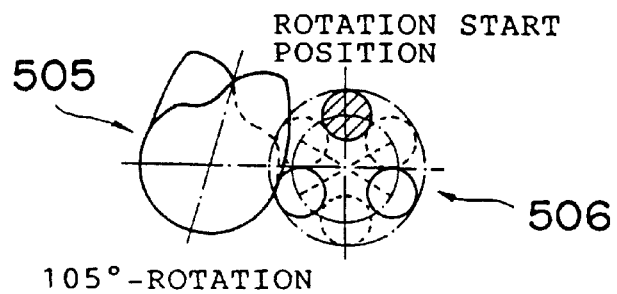
Figure 28B:
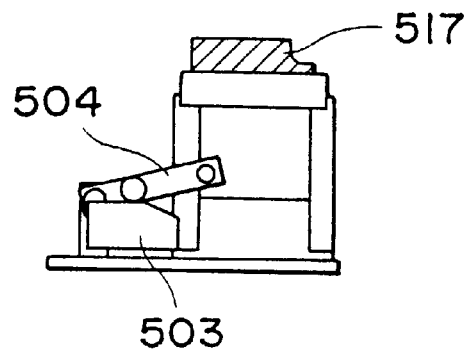
Figure 28C:
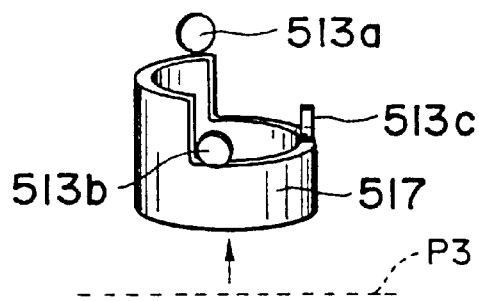
Figure 28D:
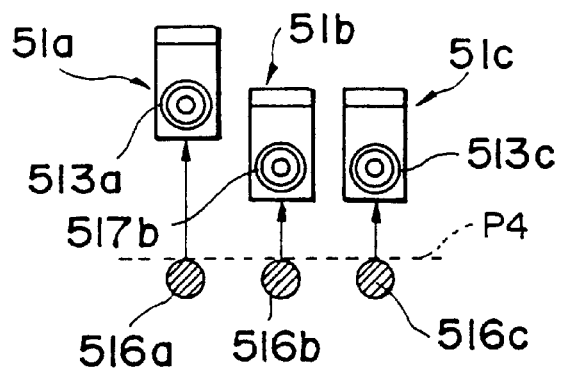
Figure 28E:
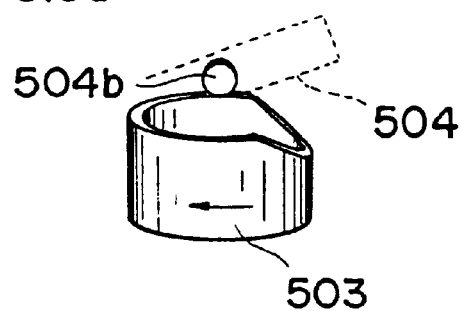
Figure 29A:
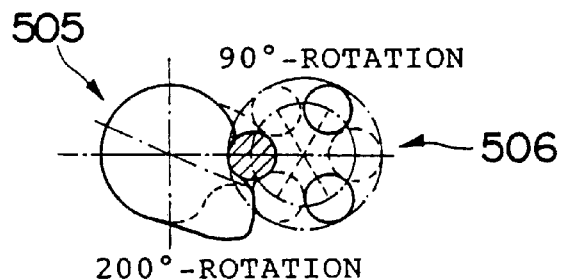
Figure 29B:
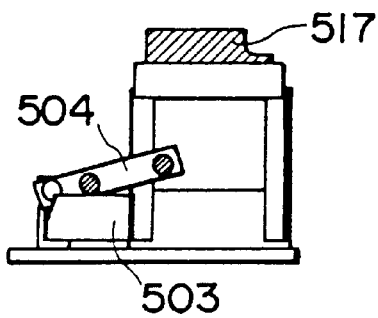
Figure 29C:
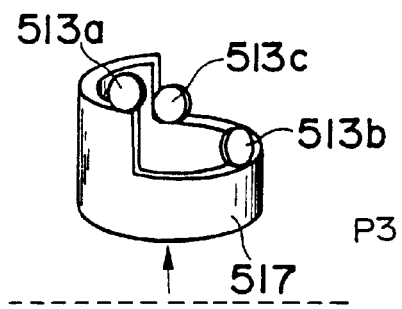
Figure 29D:
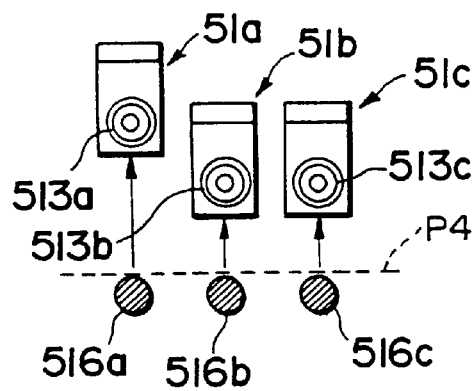
Figure 29E:
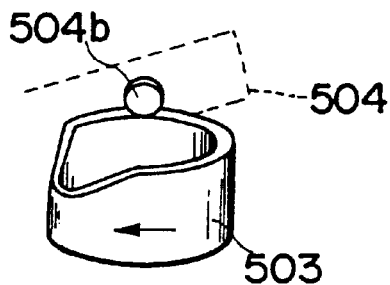
Figure 30A:
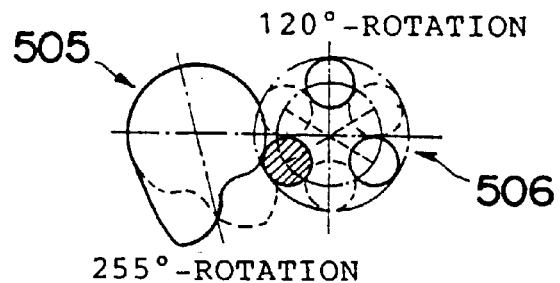
Figure 30B:
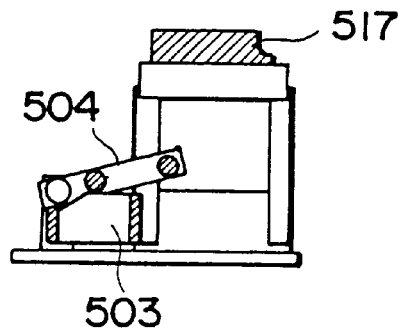
Figure 30C:
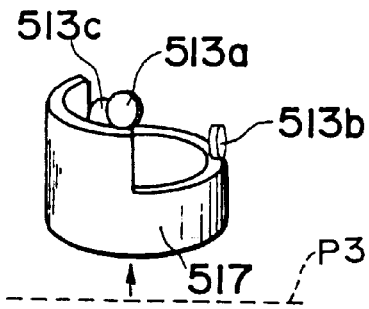
Figure 30D:
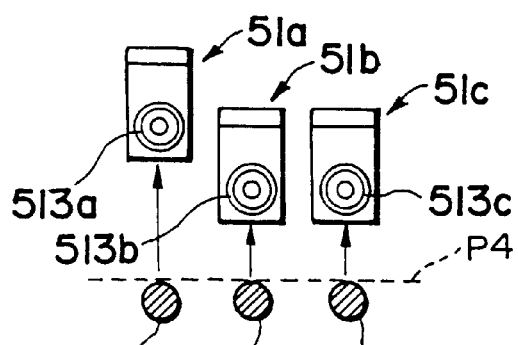
Figure 30E:
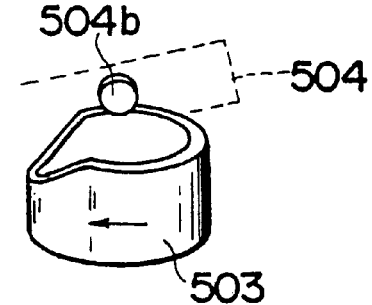
Figure 32A:
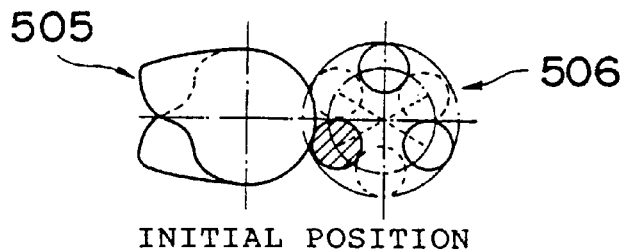
Figure 32B:
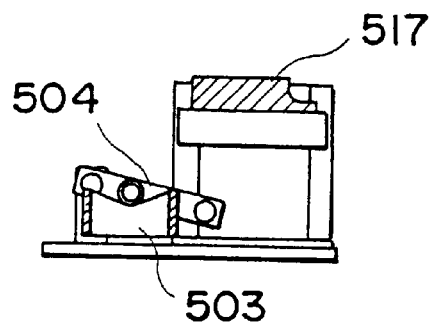
Figure 32C:
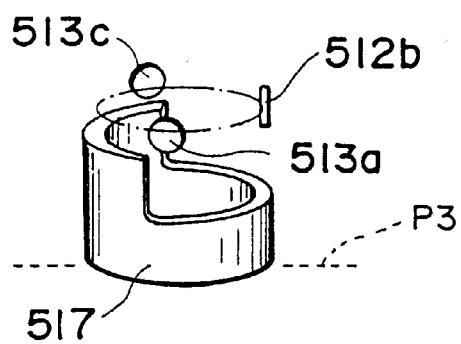
Figure 32D:
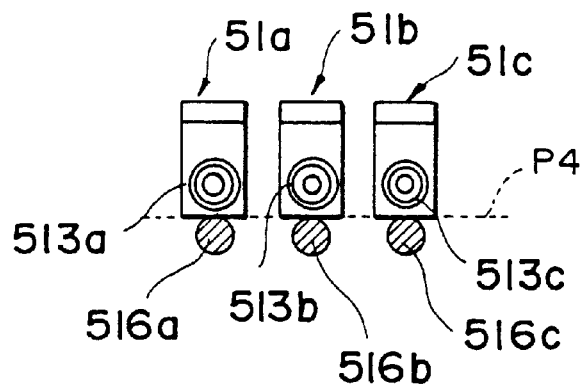
Figure 32E:
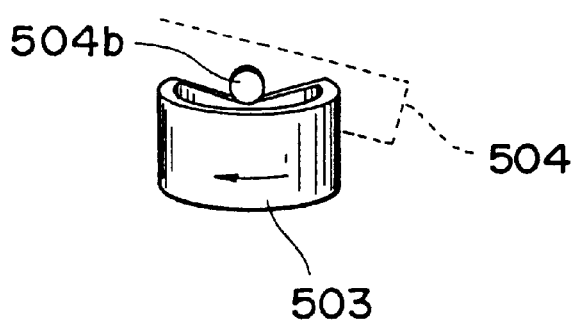

As shown in FIG. 26, when the connecting shaft 504 rotates in the direction indicated by the arrow S22, the stepped cam 517 is pushed upward in a direction indicated by an arrow S23. The pushed-up stepped cam 517, in turn, sets an arbitrary rotary arm portion at a higher position, the roller of which is in contact with the upper portion of the step of the stepped cam 517 in the direction indicated by the arrow S23 while the pushed-up stepped cam 517 supports and pushes up all rotary arm portions. As described above, in the second convey system 5, a cam mechanism that integrally rotates the first to third rotary arm portions 51a to 51c and a cam mechanism that pushes up an arbitrary one of the rotary arm portions 51a to 51c are realized. That is, this cam mechanism make the selected one of the rotary arm portions S1a to 51c set at a higher position than the other rotary arm portions.

The operation of the mechanism of the second convey system 5 that pushes up any one of the rotary arm portions 51a to 51c will be described in more detail with reference to FIGS. 27A to 32E. In FIGS. 27A to 27E to FIGS. 32A to 32E, FIGS. 27A, 28A, 29A, 30A, 31A, and 32A show the positional relationship between the driving cam mechanism 505 and the driven cam mechanism 506, FIGS. 27B, 28B, 29B, 30B, 31B, and 32B show the positional relationship between the annular cam 503 and the stepped cam 517 interlocked with the annular cam 503 through the connecting shaft 504, FIGS. 27C, 28C, 29C, 30C, 31C, and 32C show the positional relationship between the stepped cam 517 and the rollers 513a and 513b and a roller 513c of the rotary arm portions 51a to 51c, FIGS. 27D, 28D, 29D, 30D, 31D, and 32D show the positional relationship between the rollers 513a to 513c and the stoppers 516a and 516b, and a stopper 516c, and FIGS. 27E, 28E, 29E, 30E, 31E, and 32E show the positional relationship between the annular cam 503 and the roller 504b mounted on the connecting shaft 504. In these drawings, reference numerals 513c and 516c denote the roller and stopper, respectively, of the third rotary arm portion 51c, although they are not shown in other drawings. Reference symbol P3 denotes the initial setting surface of the stepped cam 517; and P4, the initial setting surface of the rotary arm portions 51a to 51c.

As shown in FIGS. 27A to 27E, when the roller 504b is located at the lowest position of the inclined portion of the annular cam 503, the rollers 513a to 513c of the first to third rotary arm portions 51a to 51c do not come in contact with the stepped cam 517, and the rotary arm portions 51a to 51c are at the same height at the lowest position P3.

From the state of FIGS. 27A to 27E, when the annular cam 503 is rotated through 105° by the motor 500, the roller 504b moves onto the flat portion of the annular cam 503 to rotate the connecting shaft 504 counterclockwise, so that the stepped cam 517 is moved upward.

During the upward movement, the stepped cam 517 comes into contact with the rollers 513a to 513c of the respective rotary arm portions 51a to 51c and thereafter moves upward together with the rollers 513a to 513c while integrally pushing them up (see FIGS. 28A to 28E).

While the annular cam 503 rotates through 105°, the distal end portions 507a and 507b of the intermittent cams 505a and 505b are respectively not in contact with the bearings 506b and 506c. Thus, the support shaft 50 does not rotate.

Hence, the first rotary arm portion 51a is set at a higher position than the remaining rotary arm portions 51b and 51c by the stepped cam 517 while all rotary arm portions 51a to 51c are pushed up by the stepped cam 517. When the first rotary arm portion 51a is at this high position, it receives the wafer 32 from the first arm head 48a, as will be described later.

From the state shown in FIGS. 28A to 28E, when the annular cam 503 further rotates through 112.50°, the height of the roller 504b does not change, so that the relationship in height among the first to third rotary arm portions 51a to 51c is maintained. Meanwhile, as the annular cam 503 rotates through 112.50°, the distal end portions 507a and 507b of the intermittent cams 505a and 505b respectively come into contact with the bearings 506b and 506c to rotate the support shaft 50. Thus, the rollers 513a to 513c rotate the upper and lower surface portions of the stepped cam 517 through 90°.

At this time, the roller 513c comes into contact with the boundary surface between the upper and lower surfaces of the stepped cam 517 (see FIGS. 29A to 29E).

From the state shown in FIGS. 29A to 29E, when the annular cam 503 further rotates through 37.50°, the roller 513c rotates to push the side surface of the stepped cam 517 while maintaining the relationship in height among the first to third rotary arm portions 51*a* to 51*c*. Thus, the stepped cam 517 rotates through 30° together with the rollers 513*a* to 513*c* (see FIGS. 30A to 30E).

As shown in FIGS. 28A to 28E and 29A to 29E, while the annular cam 503 rotates through 150°, the distal end portions 507*a* and 507*b* of the intermittent cams 505*a* and 505*b* respectively come into contact with the bearings 506*b* and 506*c* to rotate the support shaft 50 through 120°.

From the state shown in FIGS. 30A to 30E, when the annular cam 503 is rotated by the motor 500, the roller 504*b* moves from the flat portion onto the inclined portion of the annular cam 503, so that the stepped cam 517 which has been pushed up by the connecting shaft 504 moves downward (see FIGS. 31A to 31E).

When the roller 504*b* reaches the lowest position of the annular cam 503, the rollers 513*a* to 513*c* of the first to third rotary arm portions 51*a* to 51*c* are not in contact with the stepped cam 517.

Therefore, the roller 513*c* no longer pushes the side surface of the stepped cam 517, so that the stepped cam 517 is rotated through −30° by the force of a spring 370 to return to the initial position.

Figure 33:
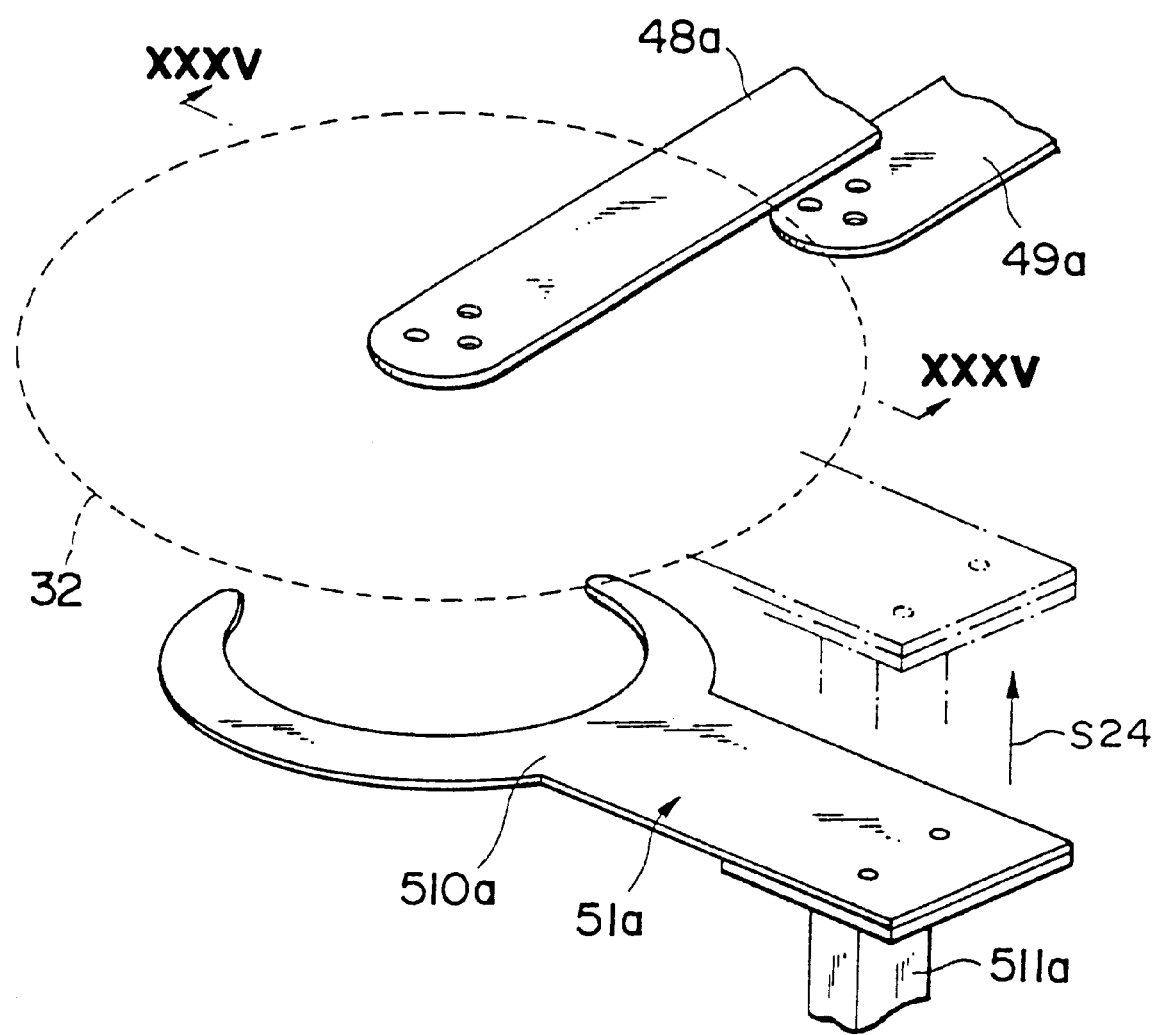
Figure 34:
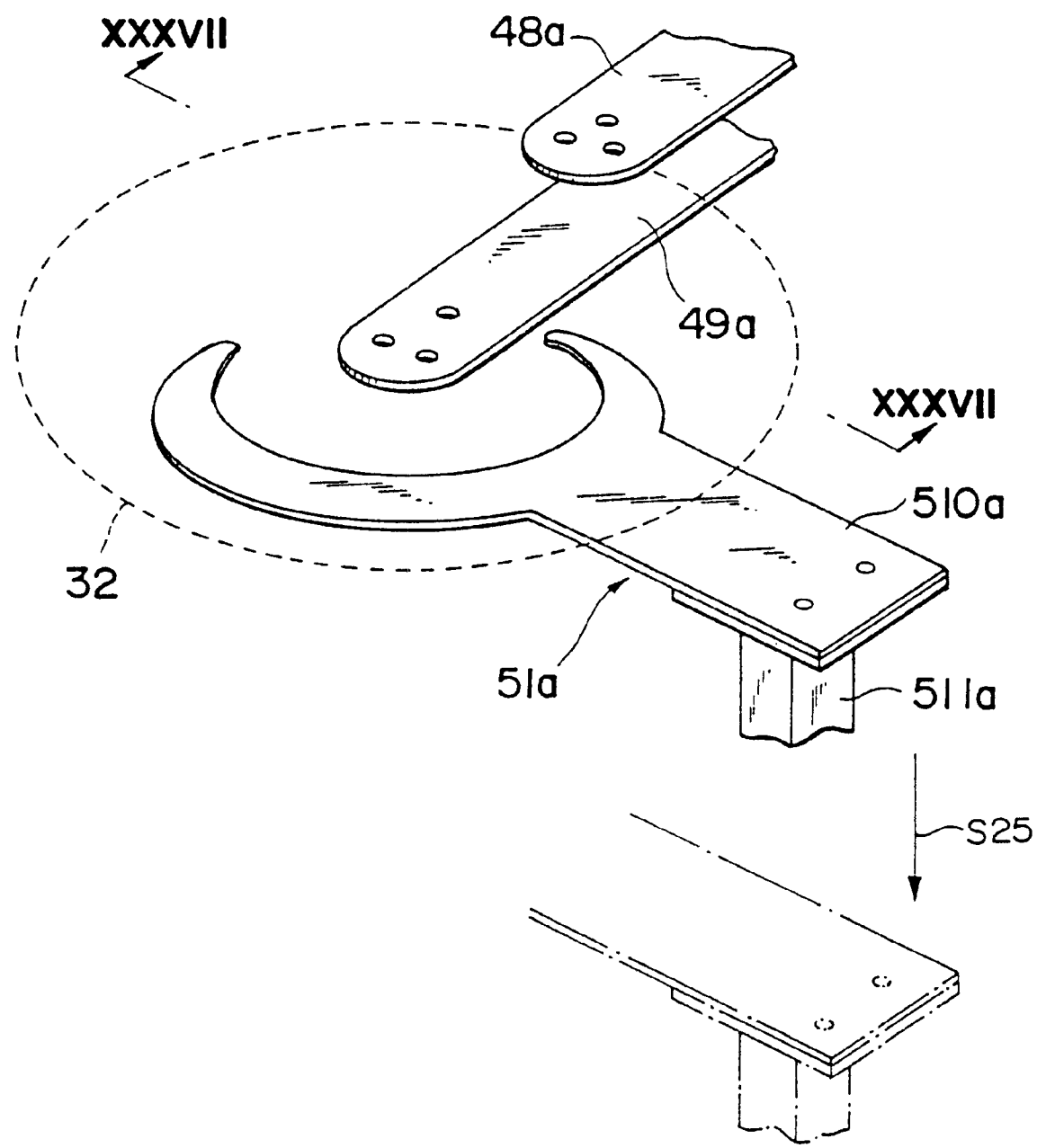
Figure 35:
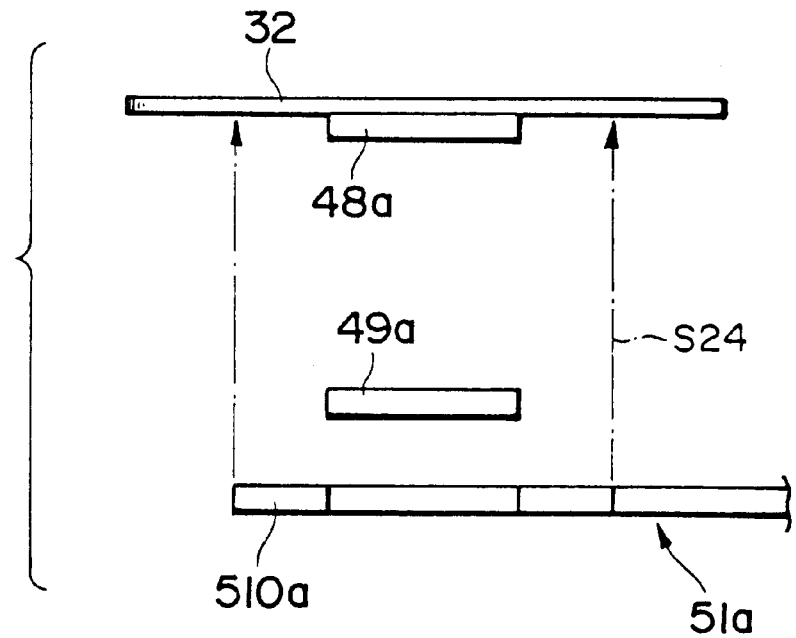
Figure 36:
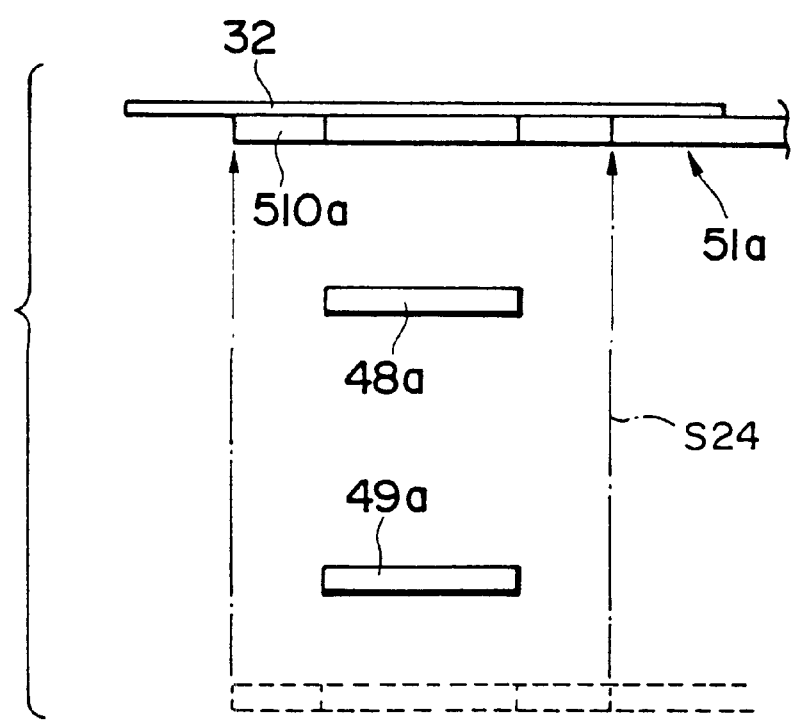
Figure 37:
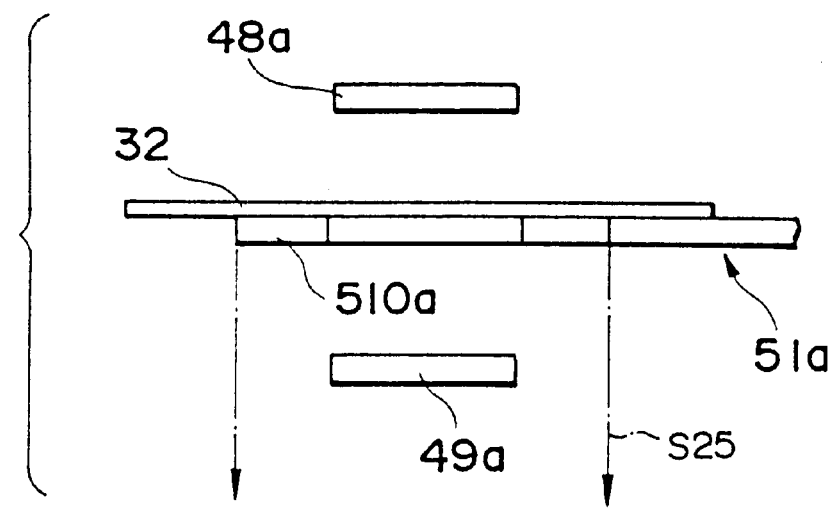
Figure 38:
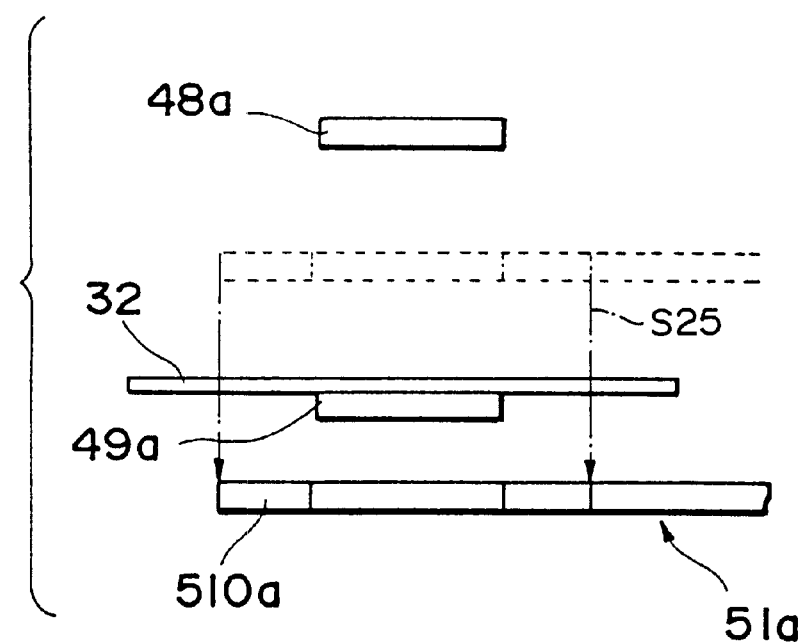

The transfer operation of the wafer 32 between the first and second convey systems 4 and 5 will be described with reference to FIGS. 33 to 38. FIG. 33 is a view for explaining the wafer convey operation from the first convey system 4 to the second convey system 5, and FIG. 34 is a view for explaining the wafer convey operation from the second convey system 5 to the first convey system 4. FIGS. 35 and 36 are sectional views taken along the line F—F of FIG. 33, in which FIG. 35 shows a state of the rotary arm portion 51*a* before movement, and FIG. 36 shows a state of the rotary arm portion 51*a* after movement. FIGS. 37 and 38 are sectional views taken along the line G—G of FIG. 34, in which FIG. 37 shows a state of the rotary arm portion 51*a* before movement, and FIG. 38 shows a state of the rotary arm portion 51*a* after movement. In the following description, other drawings will be referred to when necessary.

In this embodiment, a case will be described wherein the cassette member 3 stores twenty-five 4-inch wafers and particularly the Nth (3<N≦25) wafer is to be conveyed.

Accordingly, the second storing arm head 49*a* has received the (N−3)th wafer subjected to microscopic observation from any one of the rotary arm portions 51*a* to 51*c* and holds it. In FIG. 33, the second arm head 49*a* is in the inoperative state.

For the sake of descriptive simplicity, assume that the second arm head 49*a* has received the (N−3)th wafer from the first rotary arm portion 51*a*.

The main controller 10 moves the lifting unit 2 of the cassette member 3 to a position where the Nth wafer is to be conveyed. This main controller 10 discriminates the wafer size as 4-inch from the outputs from the first and second first switches 20*a* and 20*b*.

The main controller 10 controls the first convey system 4 to move the first and second arm heads 48*a* and 49*a* to the positions X1 and X2 of FIG. 14. When inspecting an 8-inch wafer, the main controller 10 controls the cylindrical cam 410 to move the first and second first arm heads 48*a* and 49*a* to the position X2 of FIG. 14.

The main controller 10 controls the motors 43*c* and 44*c* to move the first and second arm heads 48*a* and 49*a* into the cassette member 3.

The main controller 10 then controls the motor 42 to move the first and second arm heads 48*a* and 49*a* from the position X1 upward to the position X2 of FIG. 14.

Thus, the first arm head 48*a* moves upward along the loading cam groove 410*a* and lifts the wafers 32 in the cassette member 3 from below to be drawn by vacuum suction. The second arm head 49*a* moves downward along the loading cam groove 410*b* to receive the wafers 32 in the cassette member 3.

In this embodiment, since the wafers are transferred from and stored in the cassette member 3 substantially simultaneously by the first and second arm heads 48*a* and 49*a*, the wafer convey time can be greatly shortened.

The main controller 10 controls the motors 43*c* and 44*c*, while leaving the position of the first and second arm heads 48*a* and 49*a* in the Z direction (direction of height) at the position X2 of FIG. 14, to retract the first and second arm heads 48*a* and 49*a* from the cassette member 3.

In order to correct the height difference between the cassette member 3 and the microscopic observation system 7, the main controller 10 then controls the motor 42 to move the first and second arm heads 48*a* and 49*a* upward to the position X4 of FIG. 14.

The main controller 10 controls the motor 46 to move the first and second arm heads 48*a* and 49*a* to the position A1 of FIG. 2.

The first rotary arm portion 51*a* transfers the (N−3)th wafer to the second arm head 49*a* and waits at the position shown in FIGS. 27A to 27E.

While the first arm head 48*a* holds the wafer 32, the first rotary arm portion 51*a* is located at the position shown in FIGS. 27A to 27E and below the second arm head 49*a* as shown in FIG. 35.

The main controller 10 moves the first and second arm heads 48*a* and 49*a* to the position Al of FIG. 2, and moves the first rotary arm portion 51*a* upward to the position shown in FIGS. 28A to 28E along a direction indicated by an arrow S24, so that the first rotary arm portion 51*a* receives the Nth wafer from below the first arm head 48*a* (see FIGS. 33 and 36). At this time, the first and second arm heads 48*a* and 49*a* do not move in the direction of height.

The main controller 10 rotates the first to third rotary arm portions 51*a* to 51*c* through 120° (to set them at the positions shown in FIGS. 30A to 30E).

Hence, the first rotary arm portion 51*a* moves to the position B1 of FIG. 2, and the third rotary arm portion 51*c* holding the (N−2)th wafer moves to the position A1 of FIG. 2 to be located in a space between the first and second arm heads 48*a* and 49*a*, as shown in FIG. 37.

This is because the bearing portion 513*c* of the arm 51*c* is located at the lower surface portion of the stepped cam 517.

While the main controller 10 moves the first to third rotary arm portions 51*a* to 51*c* downward along a direction indicated by an arrow S25 (moves the first rotary arm portion 51*a* to the position shown in FIGS. 32A to 32E), the first rotary arm portion 51*a* transfers the Nth wafer to the macro observation system 6, and the third rotary arm portion 51*c* transfers the (N−2)th wafer to the second arm head 49*a*, as shown in FIG. 38.

The first convey system 4 causes the second arm head 49*a* to hold the (N−2)th wafer and moves it to the cassette member 3 again, so that the (N−2)th wafer is stored in the cassette member 3. The main controller 10 also causes the first arm head 48*a* to receive the (N+1)th wafer.

Thereafter, the above steps are repeated until all the wafers are inspected.

As has been described above in detail, in this embodiment, when wafer transfer and reception are performed between the first and second convey systems 4 and 5, the first convey system 4 does not retreat, so that wafer transfer and reception can be performed within a short period of time.

The above wafer convey systems can be applied to a wafer exposure apparatus and the like, as a matter of course.

In the second convey system 5, since the plurality of rotary arm portions 51*a* to 51*c* can be driven independently of each other in the direction of height, the first convey system 4 does not retreat.

Furthermore, since the second convey system 5 is constituted by one driving source 500 and the cam member 517 having a step, the wafer convey time can be shortened with a simple arrangement.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A wafer inspection apparatus comprising:

a setting surface on which a cassette member is mounted, the cassette member storing wafers;

an observation system that inspects each of the wafers in the cassette member at a predetermined observation position; and a first convey system having a first arm portion that individually conveys wafers from the cassette member to a first position and having a second arm portion that individually conveys wafers from a second position to the cassette member;

a second convey system that conveys the wafers from the first position to the predetermined observation position and conveys the wafers from the predetermined observation position to the second position;

wherein the first position and the second position are separated from each other along a vertical axis perpendicular to a surface of each wafer in the first and second positions, and wherein wafers positioned at said first and second positions overlie one another.

2. An apparatus according to claim 1, wherein the first convey system includes:

a support portion that holds the first and second arm portions spaced apart from each other by a predetermined height.

3. An apparatus according to claim 2, wherein the support portion includes a height correction mechanism that vertically moves the first and second arm portions.

4. An apparatus according to claim 1, wherein the second convey system includes:

a plurality of rotary arm portions each adapted to hold a wafer extracted from the cassette member;

a vertically extending support shaft that supports the plurality of rotary arm portions at a distal end portion thereof; and a driving mechanism that concurrently rotates the plurality of rotary arm portions by rotating the support shaft at a predetermined timing.

5. An apparatus according to claim 4, wherein the driving mechanism of the second convey system includes:

a first cam mechanism that rotates the support shaft at the predetermined timing; and a second cam mechanism that vertically moves at least a selected one of the plurality of rotary arm portions.

6. An apparatus according to claim 1, wherein each of the first and second arm portions includes:

an arm head that holds a wafer extracted from the cassette member;

a support arm that holds the arm head while being supported by a support portion; and a driving mechanism provided in the support arm, the driving mechanism moving the arm head in parallel with respect to a wafer convey reference surface of the after inspection apparatus.

* * * * *